United States Patent
Adachi et al.

(10) Patent No.: US 9,368,504 B2
(45) Date of Patent: Jun. 14, 2016

(54) SEMICONDUCTOR DEVICE AND MANUFACTURING METHOD THEREOF

(71) Applicant: Renesas Electronics Corporation

(72) Inventors: Kenji Adachi, Hitachinaka (JP); Yukio Maki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/459,478

(22) Filed: Aug. 14, 2014

(65) Prior Publication Data

US 2015/0076619 A1  Mar. 19, 2015

(30) Foreign Application Priority Data

Sep. 17, 2013  (JP) .................................. 2013-191924

(51) Int. Cl.

| H01L 27/11 | (2006.01) |
|---|---|
| H01L 27/02 | (2006.01) |
| H01L 21/768 | (2006.01) |
| H01L 23/485 | (2006.01) |
| H01L 23/522 | (2006.01) |

(52) U.S. Cl.
CPC ...... *H01L 27/1108* (2013.01); *H01L 21/76897* (2013.01); *H01L 23/485* (2013.01); *H01L 27/0207* (2013.01); *H01L 23/5226* (2013.01); *H01L 2924/0002* (2013.01)

(58) Field of Classification Search
None
See application file for complete search history.

(56) References Cited

U.S. PATENT DOCUMENTS

| 6,853,022 | B2 | 2/2005 | Koga et al. | |
|---|---|---|---|---|
| 2004/0147114 | A1* | 7/2004 | Park et al. | ...................... 438/666 |
| 2005/0224854 | A1* | 10/2005 | Park | .................. H01L 21/76895 257/296 |
| 2010/0123253 | A1* | 5/2010 | Ooka | ............................ 257/773 |

FOREIGN PATENT DOCUMENTS

JP  2004-079696 A  3/2004

* cited by examiner

*Primary Examiner* — Erik Kielin
(74) *Attorney, Agent, or Firm* — Sughrue Mion, PLLC

(57) ABSTRACT

Variations in the contact area between contact plugs are suppressed to suppress fluctuations in contact resistance. In three third interlayer insulating films, a contact hole is self-alignedly formed to extend through the portions thereof interposed between two wiring portions and the portions thereof interposed between two gate wiring portions and reach a first polysilicon plug. In the contact hole, a second polysilicon plug is formed to come in contact with the first polysilicon plug.

15 Claims, 31 Drawing Sheets

FIG. 16A
FIG. 16B
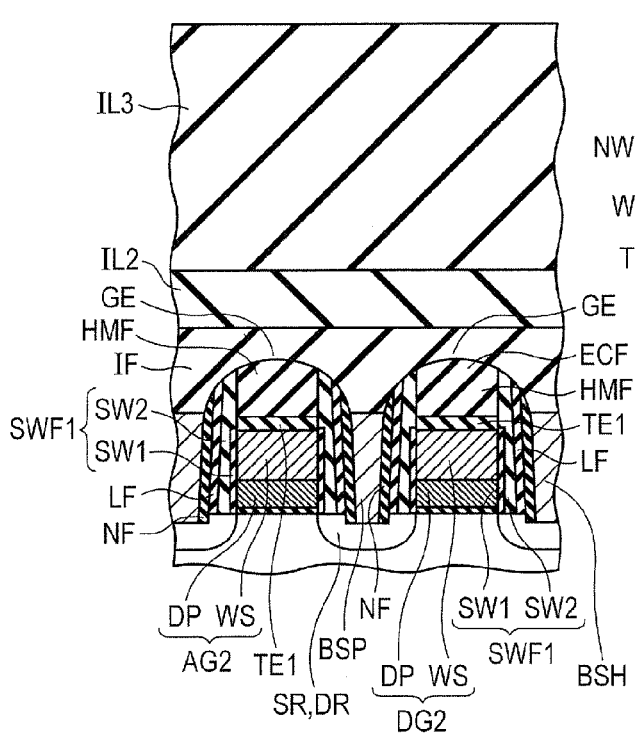
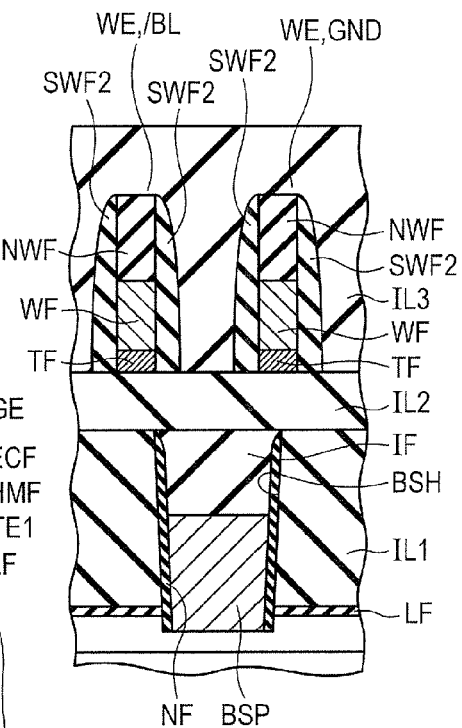

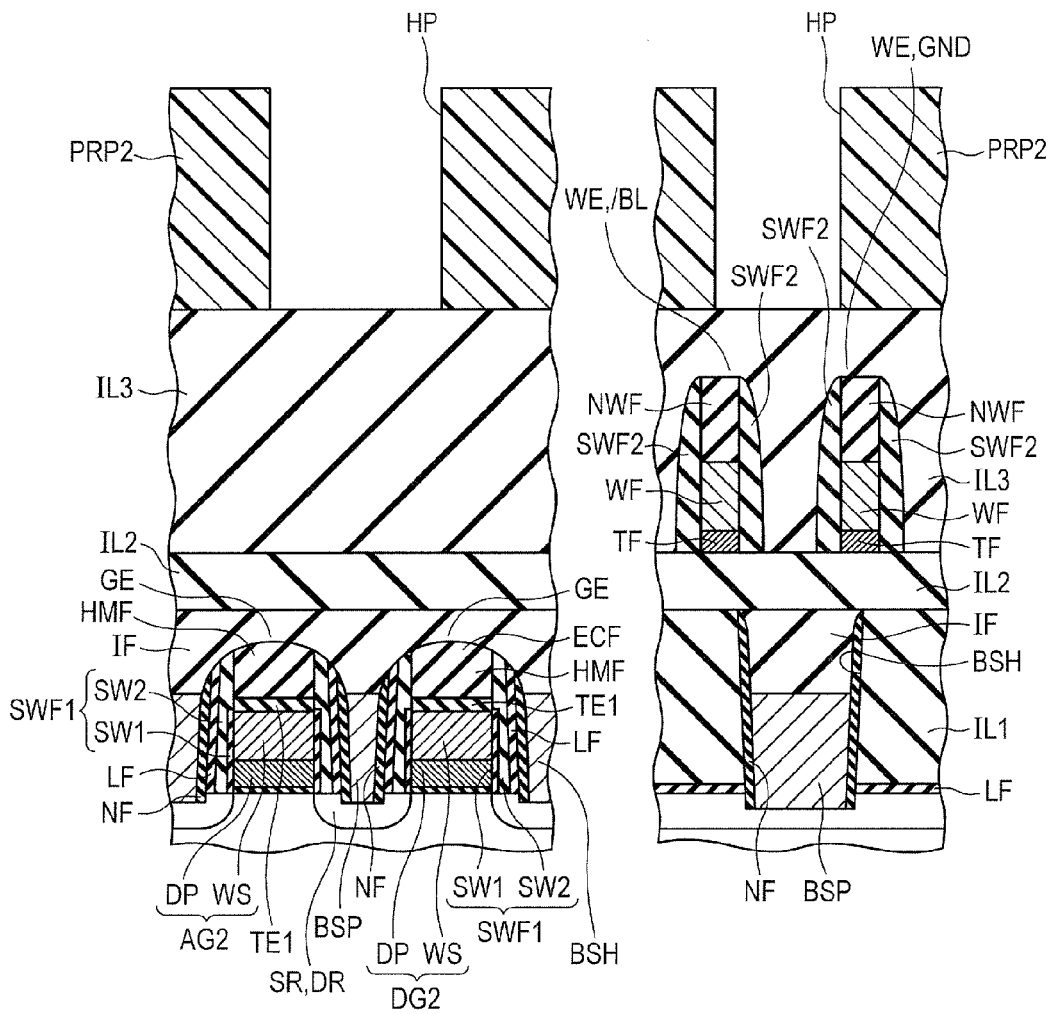

FIG. 23A
FIG. 23B
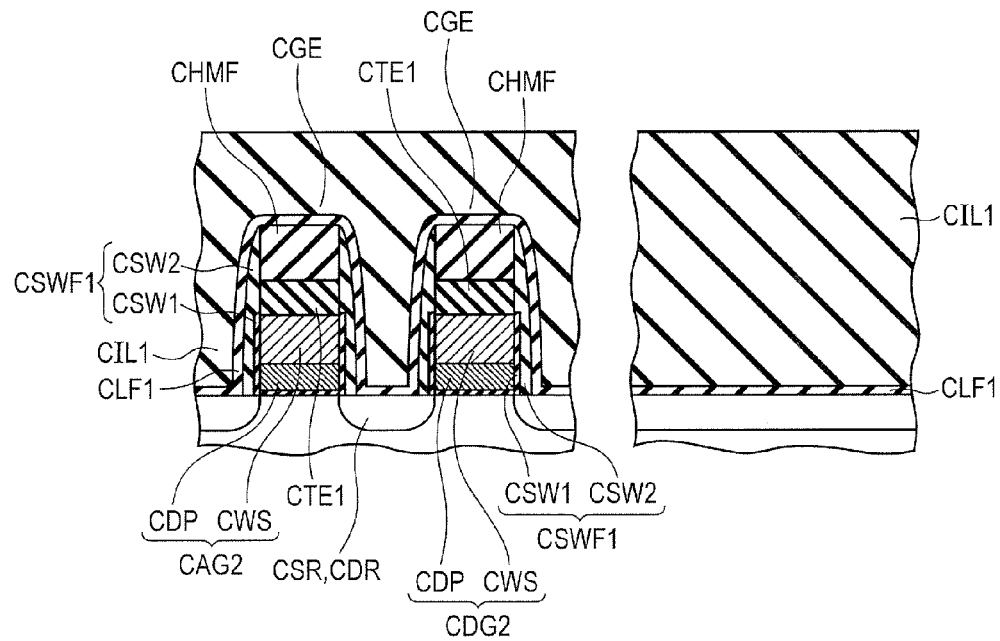
FIG. 24A
FIG. 24B
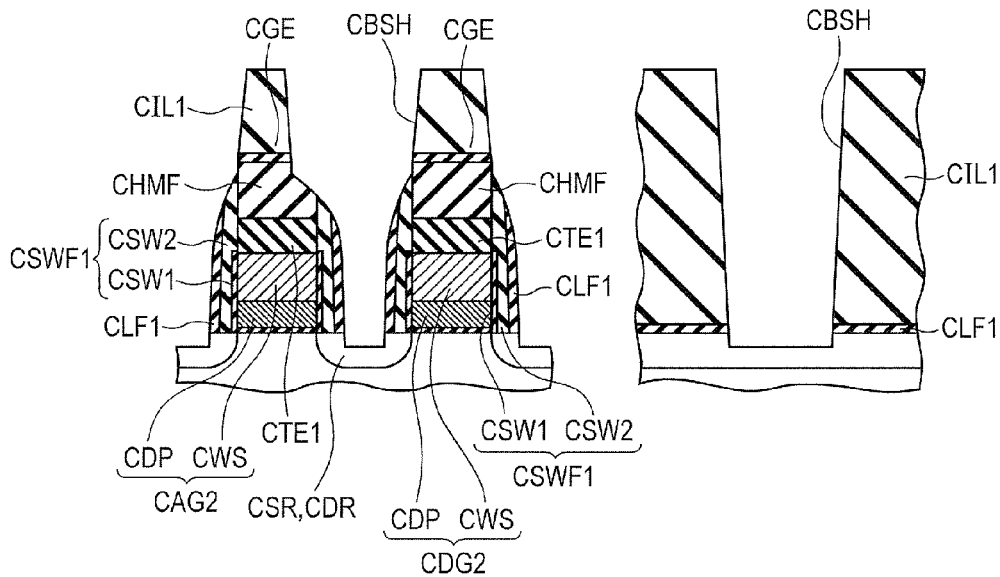

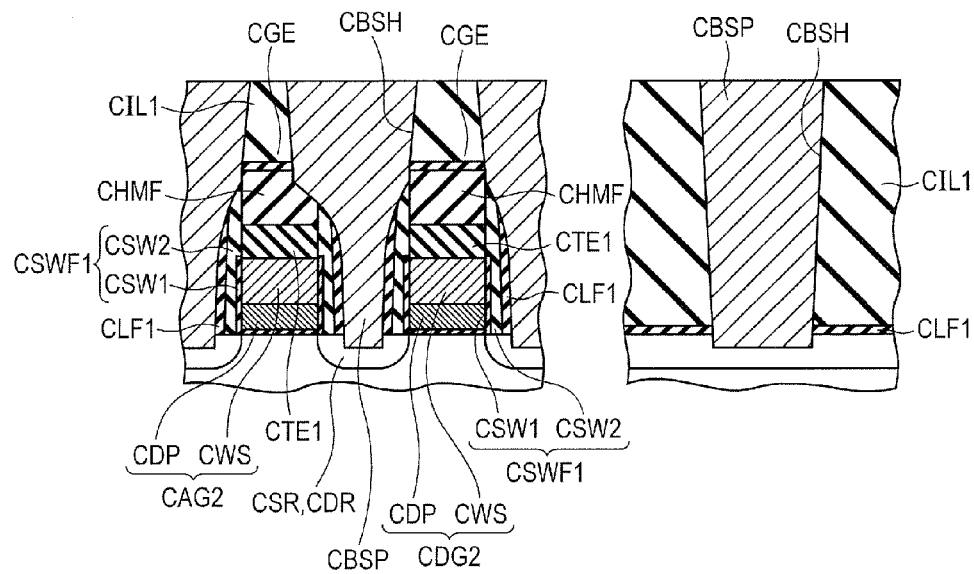
FIG. 25A
FIG. 25B
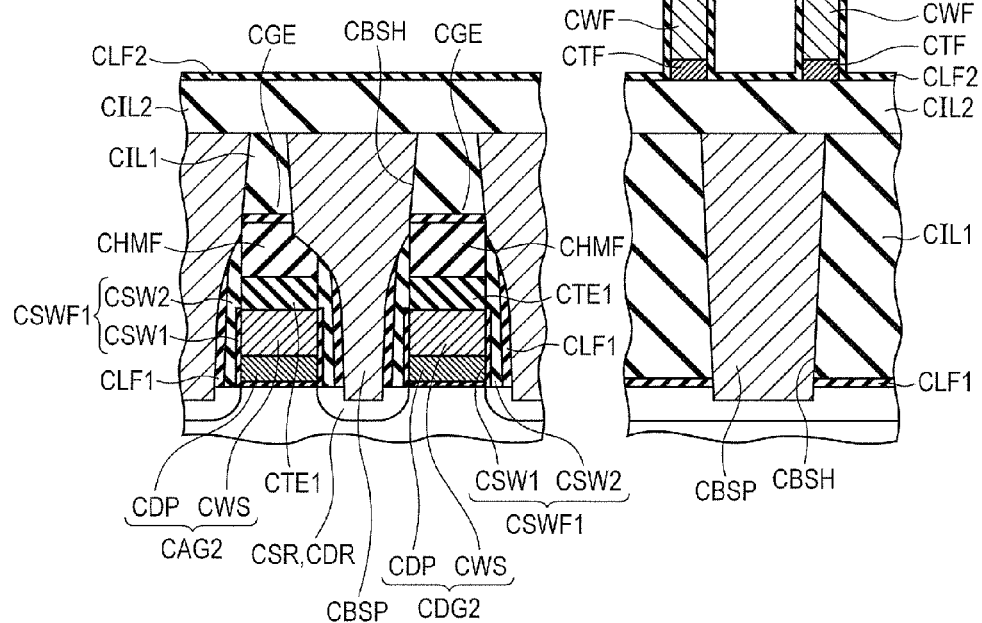
FIG. 26A
FIG. 26B

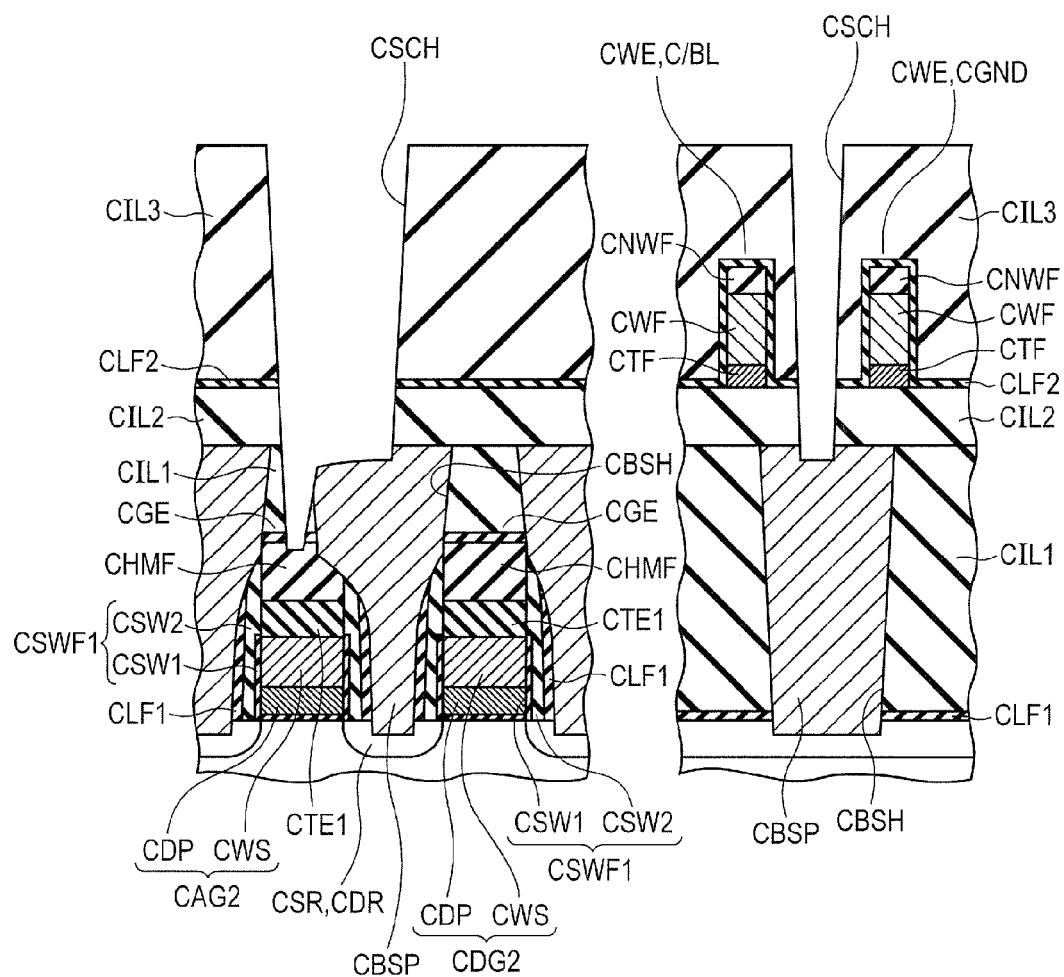

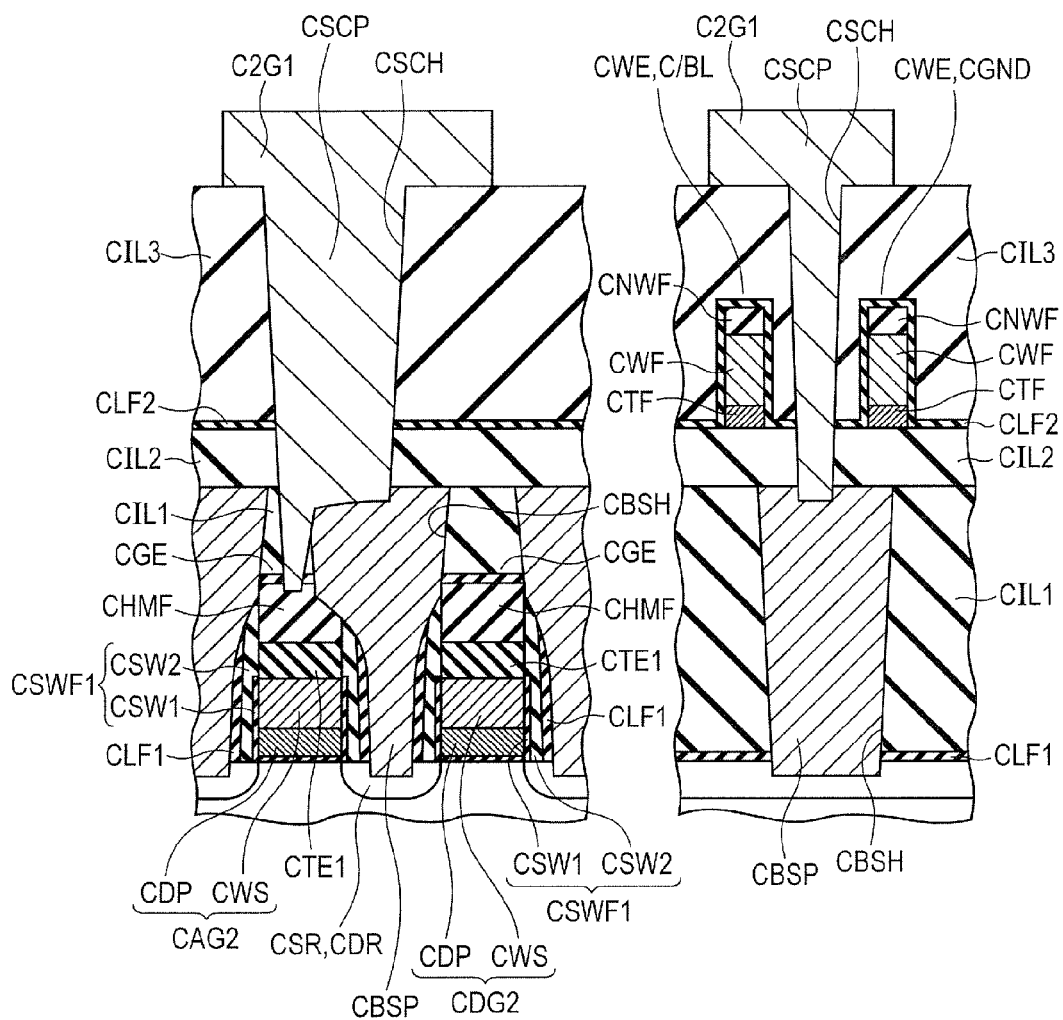

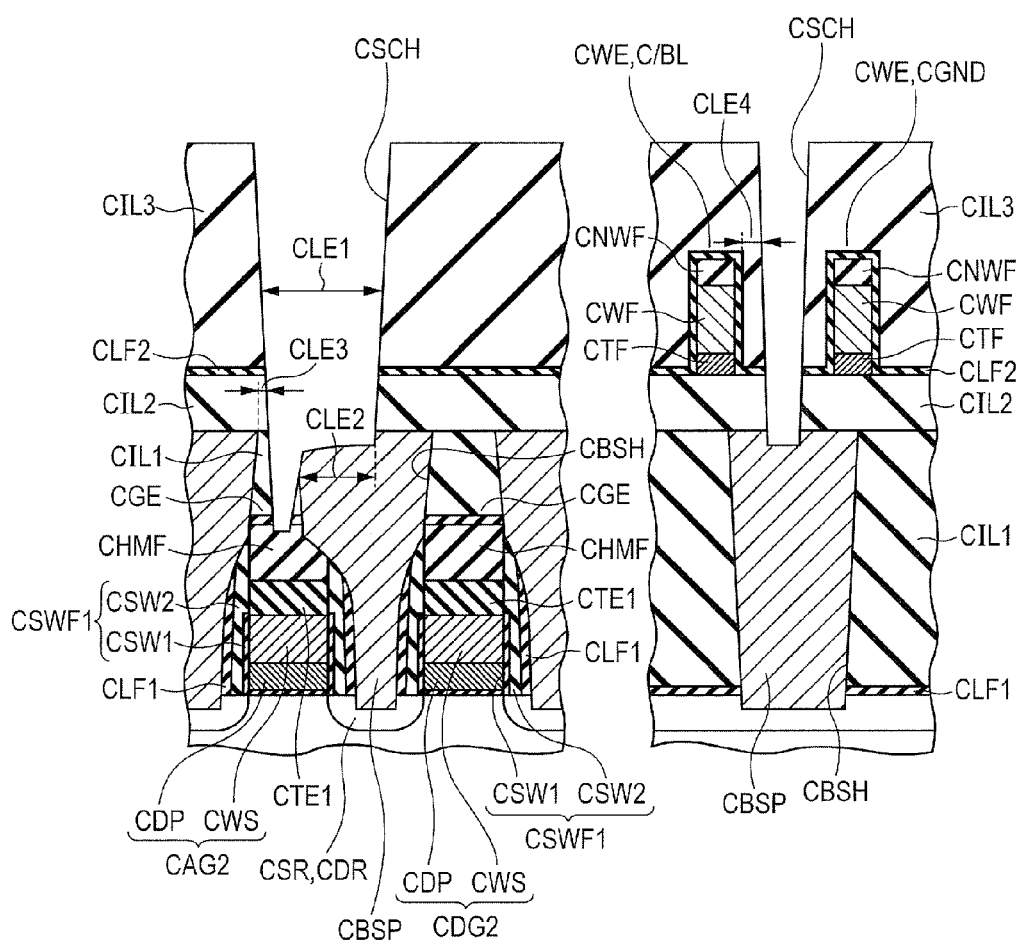

FIG. 33A
FIG. 33B
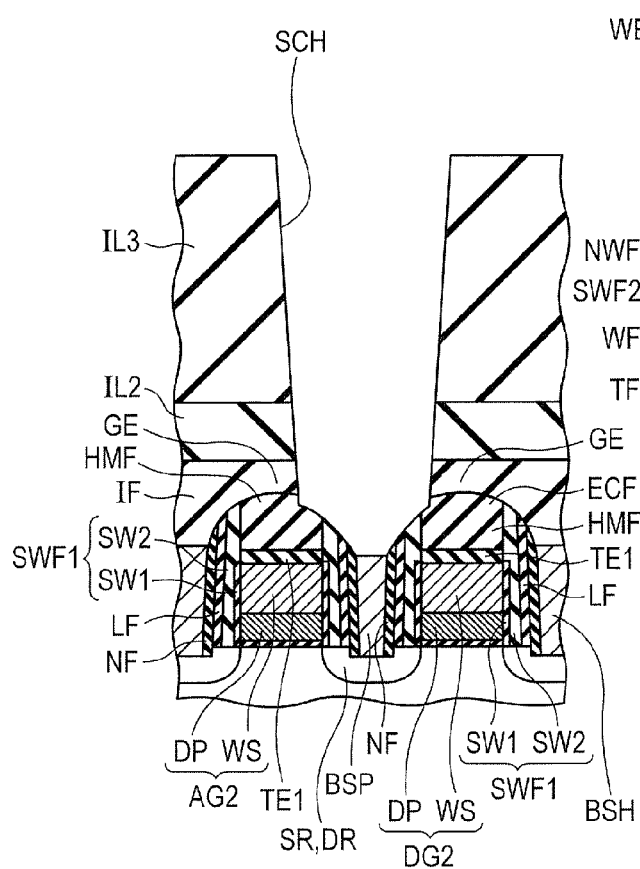
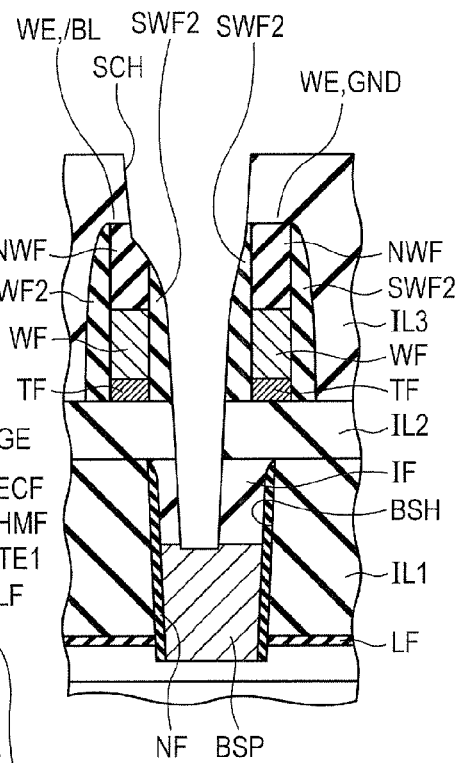

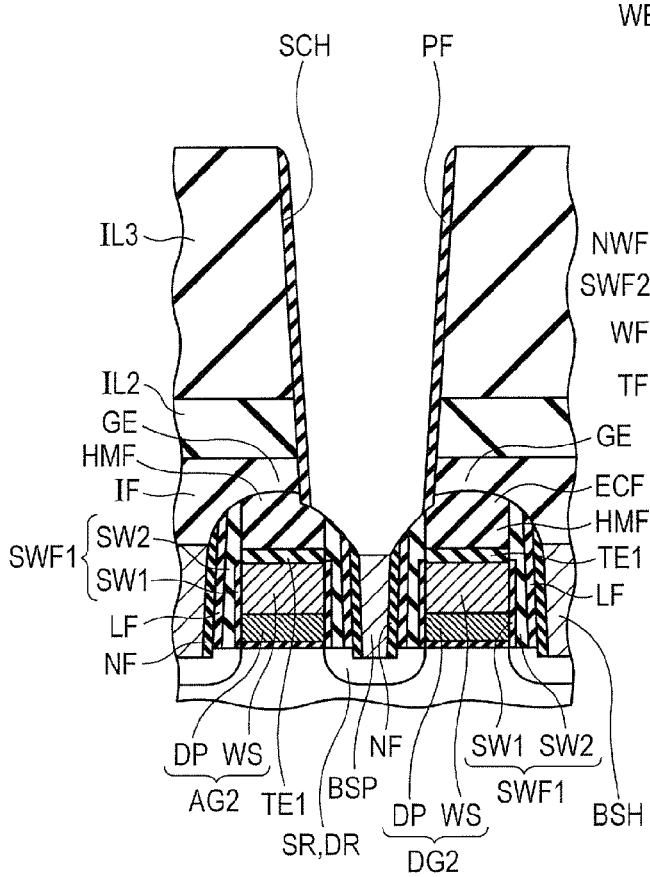
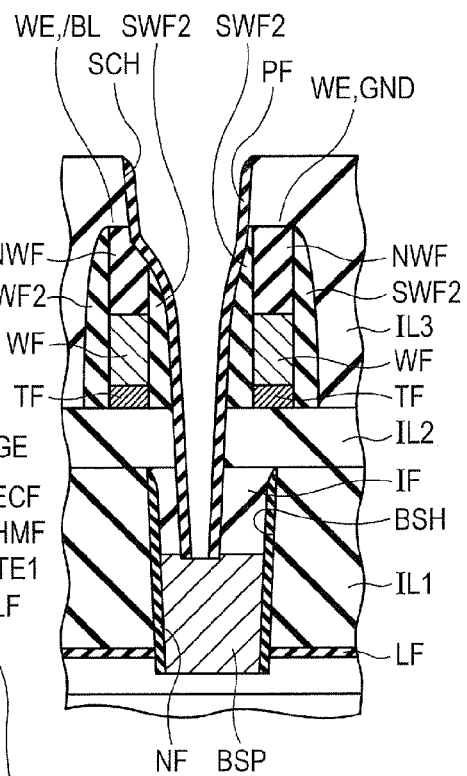
FIG. 35A
FIG. 35B

SEMICONDUCTOR DEVICE AND MANUFACTURING METHOD THEREOF

CROSS-REFERENCE TO RELATED APPLICATIONS

The disclosure of Japanese Patent Application No. 2013-191924 filed on Sep. 17, 2013 including the specification, drawings and abstract is incorporated herein by reference in its entirety.

BACKGROUND

The present invention relates to a semiconductor device and a manufacturing method thereof, and particularly can be used appropriately for a semiconductor device including a static random access memory and a manufacturing method of such a semiconductor device.

An SRAM (Static Random Access Memory) is a type of semiconductor memory. One SRAM memory cell includes two access transistors, two drive transistors, and two load transistors so that the six transistors need to be formed over a semiconductor substrate. Accordingly, there is a limit to a reduction in the area occupied by the SRAM memory cell.

To eliminate the limit, a so-called advanced SRAM has been proposed in which, to the two load transistors among the six transistors, thin-film transistors (TFTs) are applied. In the advanced SRAM, by forming the load transistors made of the thin-film transistors over the interlayer insulating film covering the access transistors and the drive transistors, the stacked configuration of the SRAM memory cell has been implemented.

In the advanced SRAM, the source regions of the access transistors and the drain regions of the drive transistors are coupled to local lines in an upper layer via polysilicon plugs (bit-line storage contact plugs) formed between the gate electrodes of the access transistors and the gate electrodes of the drive transistors and polysilicon plugs (storage node contact plugs) formed between bit lines and ground lines. The source regions and the drain regions thereof are further electrically coupled to the load transistors or the like via the local lines. Note that examples of Patent Document disclosing such an advanced SRAM include Patent Document 1.

RELATED ART DOCUMENT

Patent Document

[Patent Document 1]
Japanese Unexamined Patent Publication No. 2004-79696

SUMMARY

However, it is assumed that, in a semiconductor device including a conventional advanced SRAM, the following problems occur.

As described above, the source regions of the access transistors and the drain regions of the drive transistors are electrically coupled to the load transistors or the like via the bit-line storage contact plugs, the storage node contact plugs, or the like.

Each of the bit-line storage contact plugs is formed as follows. First, between a gate wiring portion including the gate electrode of the access transistor and a gate wiring portion including the gate electrode of the drive transistor, a contact hole is self-alignedly formed. Then, in the contact hole, a polysilicon film is embedded to form the bit-line storage contact plug.

Each of the storage node contact plugs is formed as follows. First, between the bit line and the ground line, a contact hole (storage node contact hole) is formed by microfabrication to expose the bit-line storage contact plug without exposing the bit line or the ground line. Then, in the contact hole, a polysilicon film is embedded to form the storage node contact plug.

In recent years, with the increasing miniaturization of semiconductor devices, it has been required to also reduce the size of the storage node contact hole. However, a situation has been encountered where it is difficult to form the storage node contact hole in the reduced space between the bit line and the ground line without exposing the bit line or the ground line.

Accordingly, it is assumed that the contact area between the storage node contact plug and the bit-line storage contact plug varies to fluctuate the contact resistance.

Other problems and novel features of the present invention will become apparent from a statement in the present specification and the accompanying drawings.

According to an embodiment, a contact plug formed so as to extend from above third and fourth wiring portions through between the third and fourth wiring portions and between first and second wiring portions and reach a semiconductor substrate extends outwardly from the portion thereof located between the third and fourth wiring portions toward a position directly above at least one of the third and fourth wiring portions to hang thereover and extends outwardly from the portion thereof located between the first and second wiring portions toward a position directly above at least one of the first and second wiring portions to hang thereover.

According to another embodiment, a contact plug formed so as to extend through second and first interlayer insulating films and reach a semiconductor substrate is formed so as to be embedded in a contact hole which is self-alignedly formed to extend through the portions of the second and first interlayer insulating films located between third and fourth wiring portions and the portions thereof located between first and second wiring portions.

According to still another embodiment, the step of forming a contact plug extending through second and first interlayer insulating films to reach a semiconductor substrate includes the steps of performing etching treatment on each of the second and first interlayer insulating films, while substantially leaving a covering insulating film over wiring portions, to self-alignedly form a contact hole between third and fourth wiring portions and between first and second wiring portions, and form, in the contact hole, a conductive film serving as the contact plug.

According to the embodiment, it is possible to suppress fluctuations in contact resistance.

According to the other embodiment, it is possible to suppress fluctuations in contact resistance.

According to the still other embodiment, it is possible to manufacture a semiconductor device in which fluctuations in contact resistance are suppressed.

BRIEF DESCRIPTION OF THE DRAWINGS

FIGS. 7A and 7B are partial cross-sectional views in the step shown in FIG. 6 in Embodiment 1, of which FIG. 7A is the partial cross-sectional view along the sectional line VIIA-VIIA shown in FIG. 6 and FIG. 7B is the partial cross-sectional view along the sectional line VIIB-VIIB shown in FIG. 6;

FIGS. 9A and 9B are partial cross-sectional views in the step shown in FIG. 8 in Embodiment 1, of which FIG. 9A is the partial cross-sectional view along the sectional line IXA-IXA shown in FIG. 8 and FIG. 9B is the partial cross-sectional view along the sectional line IXB-IXB shown in FIG. 8;

FIGS. 10A and 10B are partial cross-sectional views showing the step performed after the step shown in FIGS. 9A and 9B in Embodiment 1, of which FIG. 10A is the partial cross-sectional view along a sectional line corresponding to the sectional line IXA-IXA shown in FIG. 8 and FIG. 10B is the partial cross-sectional view along a sectional line corresponding to the sectional line IXB-IXB shown in FIG. 8;

FIGS. 11A and 11B are partial cross-sectional views showing the step performed after the step shown in FIGS. 10A and 10B in Embodiment 1, of which FIG. 11A is the partial cross-sectional view along the sectional line corresponding to the sectional line IXA-IXA shown in FIG. 8 and FIG. 11B is the partial cross-sectional view along the sectional line corresponding to the sectional line IXB-IXB shown in FIG. 8;

FIGS. 12A and 12B are partial cross-sectional views showing the step performed after the step shown in FIGS. 11A and 11B in Embodiment 1, of which FIG. 12A is the partial cross-sectional view along the sectional line corresponding to the sectional line IXA-IXA shown in FIG. 8 and FIG. 12B is the partial cross-sectional view along the sectional line corresponding to the sectional line IXB-IXB shown in FIG. 8;

FIGS. 13A and 13B are partial cross-sectional views showing the step performed after the step shown in FIGS. 12A and 12B in Embodiment 1, of which FIG. 13A is the partial cross-sectional view along the sectional line corresponding to the sectional line IXA-IXA shown in FIG. 8 and FIG. 13B is the partial cross-sectional view along the sectional line corresponding to the sectional line IXB-IXB shown in FIG. 8;

FIGS. 14A and 14B are partial cross-sectional views showing the step performed after the step shown in FIGS. 13A and 13B in Embodiment 1, of which FIG. 14A is the partial cross-sectional view along the sectional line corresponding to the sectional line IXA-IXA shown in FIG. 8 and FIG. 14B is the partial cross-sectional view along the sectional line corresponding to the sectional line IXB-IXB shown in FIG. 8;

FIGS. 15A and 15B are partial cross-sectional views showing the step performed after the step shown in FIGS. 14A and 14B in Embodiment 1, of which FIG. 15A is the partial cross-sectional view along the sectional line corresponding to the sectional line IXA-IXA shown in FIG. 8 and FIG. 15B is the partial cross-sectional view along the sectional line corresponding to the sectional line IXB-IXB shown in FIG. 8;

FIGS. 16A and 16B are partial cross-sectional views showing the step performed after the step shown in FIGS. 15A and 15B in Embodiment 1, of which FIG. 16A is the partial cross-sectional view along the sectional line corresponding to the sectional line IXA-IXA shown in FIG. 8 and FIG. 16B is the partial cross-sectional view along the sectional line corresponding to the sectional line IXB-IXB shown in FIG. 8;

FIGS. 18A and 18B are partial cross-sectional views in the step shown in FIG. 17 in Embodiment 1, of which FIG. 18A is the partial cross-sectional view along the sectional line XVIIIA-XVIIIA shown in FIG. 17 and FIG. 18B is the partial cross-sectional view along the sectional line XVIIIB-XVIIIB shown in FIG. 17;

FIGS. 19A and 19B are partial cross-sectional views showing the step performed after the step shown in FIGS. 18A and 18B in Embodiment 1, of which FIG. 19A is the partial cross-sectional view along a sectional line corresponding to the sectional line XVIIIA-XVIIIA shown in FIG. 17 and FIG. 19B is the partial cross-sectional view along a sectional line corresponding to the sectional line XVIIIB-XVIIIB shown in FIG. 17;

FIGS. 20A and 20B are partial cross-sectional views showing the step performed after the step shown in FIGS. 19A and 19B in Embodiment 1, of which FIG. 20A is the partial cross-sectional view along the sectional line corresponding to the sectional line XVIIIA-XVIIIA shown in FIG. 17 and FIG. 20B is the partial cross-sectional view along the sectional line corresponding to the sectional line XVIIIB-XVIIIB shown in FIG. 17;

FIGS. 21A and 21B are partial cross-sectional views showing the step performed after the step shown in FIGS. 20A and 20B in Embodiment 1, of which FIG. 21A is the partial cross-sectional view along the sectional line corresponding to the sectional line XVIIIA-XVIIIA shown in FIG. 17 and FIG. 21B is the partial cross-sectional view along the sectional line corresponding to the sectional line XVIIIB-XVIIIB shown in FIG. 17;

FIGS. 22A and 22B are partial cross-sectional views showing the step performed after the step shown in FIGS. 21A and 21B in Embodiment 1, of which FIG. 22A is the partial cross-sectional view along the sectional line corresponding to the sectional line XVIIIA-XVIIIA shown in FIG. 17 and FIG. 22B is the partial cross-sectional view along the sectional line corresponding to the sectional line XVIIIB-XVIIIB shown in FIG. 17;

FIGS. 23A and 23B are cross-sectional views showing a step of a manufacturing method of a semiconductor device including an advanced SRAM memory cell according to a comparative example, of which FIG. 23A is the partial cross-sectional view showing a step performed before a step corresponding to the step shown in FIG. 7A and FIG. 23B is the partial cross-sectional view showing a step performed before a step corresponding to the step shown in FIG. 7B;

FIGS. 24A and 24B are partial-cross-sectional views showing a step performed after the step shown in FIGS. 23A and 23B, of which FIG. 24A is the partial cross-sectional view showing the step corresponding to the step shown in FIG. 9A and FIG. 24B is the partial cross-sectional view showing the step corresponding to the step shown in FIG. 9B;

FIGS. 25A and 25B are partial-cross-sectional views showing a step performed after the step shown in FIGS. 24A and 24B, of which FIG. 25A is the partial cross-sectional view showing a step performed after a step corresponding to the step shown in FIG. 10A and FIG. 25B is the partial cross-sectional view showing a step performed after a step corresponding to the step shown in FIG. 10B;

FIGS. 26A and 26B are partial-cross-sectional views showing a step performed after the step shown in FIGS. 25A and 25B, of which FIG. 26A is the partial cross-sectional view showing a step corresponding to the step shown in FIG. 15A and FIG. 26B is the partial cross-sectional view showing a step corresponding to the step shown in FIG. 15B;

FIGS. 27A and 27B are partial-cross-sectional views showing a step performed after the step shown in FIGS. 26A and 26B, of which FIG. 27A is the partial cross-sectional view showing a step corresponding to the step shown in FIG. 20A and FIG. 27B is the partial cross-sectional view showing a step corresponding to the step shown in FIG. 20B;

FIGS. 28A and 28B are partial-cross-sectional views showing a step performed after the step shown in FIGS. 27A and 27B, of which FIG. 28A is the partial cross-sectional view showing a step corresponding to the step shown in FIG. 22A and FIG. 28B is the partial cross-sectional view showing a step corresponding to the step shown in FIG. 22B;

FIGS. 29A and 29B are partial cross-sectional views for illustrating a problem in a manufacturing method of the semiconductor device including the advanced SRAM memory cell according to the comparative example, of which FIG. 29A is the partial cross-sectional view showing the step shown in FIG. 27A and FIG. 29B is the partial cross-sectional view showing the step shown in FIG. 27B;

FIGS. 30A and 30B are first partial cross-sectional views for illustrating the function/effect of the semiconductor device including the advanced SRAM memory cell according to Embodiment 1, of which FIG. 30A is a partial cross-sectional view showing the step shown in FIG. 20A and FIG. 30B is a partial cross-sectional view showing the step shown in FIG. 20B;

FIGS. 31A and 31B are second partial cross-sectional views for illustrating the function/effect of the semiconductor device including the advanced SRAM memory cell according to Embodiment 1, of which FIG. 31A is a partial cross-sectional view showing the step shown in FIG. 22A and FIG. 31B is a partial cross-sectional view showing the step shown in FIG. 22B;

FIGS. 33A and 33B are partial cross-sectional views showing a step of a manufacturing method of the semiconductor device including the advanced SRAM memory cell in Embodiment 2, of which FIG. 33A is the partial cross-sectional view along the sectional line corresponding to the sectional line XVIIIA-XVIIIA shown in FIG. 17 and FIG. 33B is the partial cross-sectional view along the sectional line corresponding to the sectional line XVIIIB-XVIIIB shown in FIG. 17;

FIGS. 34A and 34B are partial cross-sectional views showing a step performed after the step shown in FIGS. 33A and 33B in Embodiment 2, of which FIG. 34A is the partial cross-sectional view along the sectional line corresponding to the sectional line XVIIIA-XVIIIA shown in FIG. 17 and FIG. 34B is the partial cross-sectional view along the sectional line corresponding to the sectional line XVIIIB-XVIIIB shown in FIG. 17;

FIGS. 35A and 35B are partial cross-sectional views showing a step performed after the step shown in FIGS. 34A and 34B in Embodiment 2, of which FIG. 35A is the partial cross-sectional view along the sectional line corresponding to the sectional line XVIIIA-XVIIIA shown in FIG. 17 and FIG. 35B is the partial cross-sectional view along the sectional line corresponding to the sectional line XVIIIB-XVIIIB shown in FIG. 17; and FIGS. 36A and 36B are partial cross-sectional views showing a step performed after the step shown in FIGS. 35A and 35B in Embodiment 2, of which FIG. 36A is the partial cross-sectional view along the sectional line corresponding to the sectional line XVIIIA-XVIIIA shown in FIG. 17 and FIG. 36B is the partial cross-sectional view along the sectional line corresponding to the sectional line XVIIIB-XVIIIB shown in FIG. 17.

DETAILED DESCRIPTION

Embodiment 1

A description will be given here of a semiconductor device including an advanced SRAM memory cell as an example of a semiconductor device. First, the description will be given of an equivalent circuit of the advanced SRAM memory cell.

Figure 1:
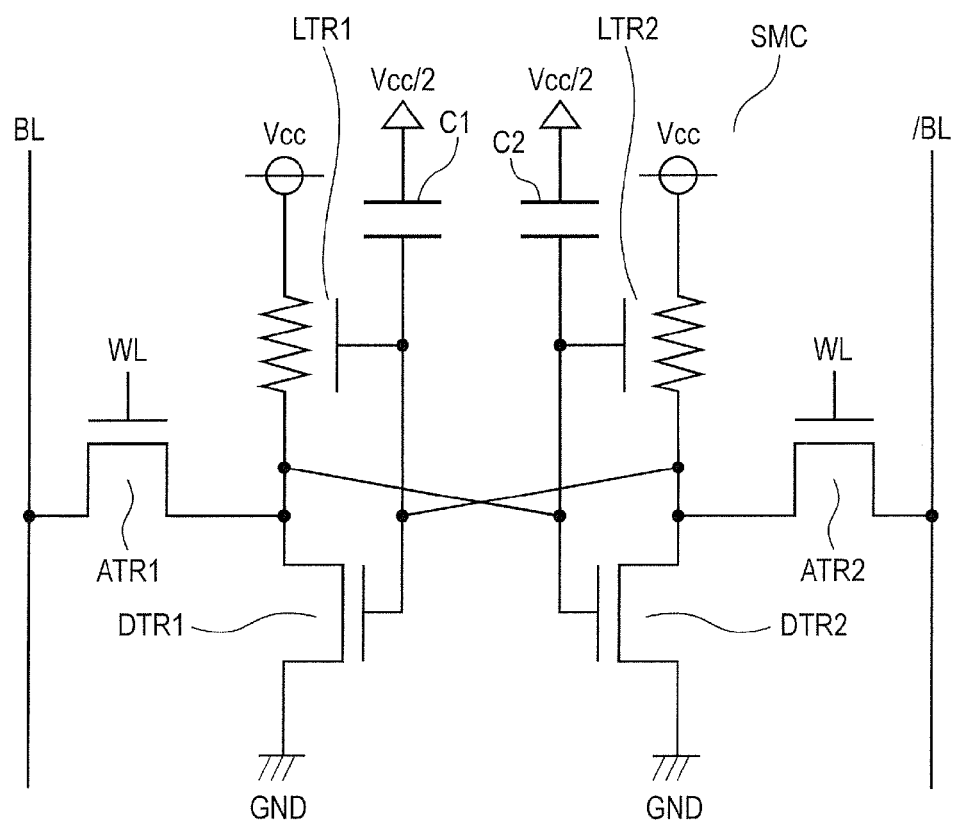
FIG. 1 is a view showing an equivalent circuit of an advanced SRAM memory cell in a semiconductor device according to each of embodiments.

As shown in FIG. 1, an SRAM memory cell SMC includes bit lines BL and /BL, word lines WL, a pair of access transistors ATR1 and ATR2, a pair of drive transistors DTR1 and DTR2, a pair of load transistors LTR1 and LTR2, and a pair of capacitors C1 and C2. In the advanced SRAM memory cell SMC, to the load transistors LTR1 and LTR2, p-channel thin-film transistors (TFTs) are applied. To the other drive transistors DTR1 and DTR2 and access transistors ATR1 and ATR2, n-channel MOS (Metal Oxide Semiconductor) transistors are applied.

The drive transistor DTR1 and the load transistor LTR1 form one inverter. Also, the drive transistor DTR2 and the load transistor LTR2 form another inverter. The one inverter and the other inverter form a flip-flop circuit so that a process referred to as refreshing which restores charges as information to the original state in predetermined periods is no longer required. The charges as information are held in the capacitors C1 and C2 to allow prevention of a so-called soft error.

Each of the gate electrodes of the drive transistor DTR1 and the load transistor LTR1 and one of the electrodes of the capacitor C1 are electrically coupled to the source (region) of the access transistor ATR2. The source (region) of the access transistor ATR2 is electrically coupled to each of the drain (regions) of the drive transistor DTR2 and the load transistor LTR2. The region coupled thereto functions as a storage node.

Each of the gate electrodes of the drive transistor DTR2 and the load transistor LTR2 and one of the electrodes of the capacitor C2 are electrically coupled to the source (region) of the access transistor ATR1. The source (region) of the access transistor ATR1 is electrically coupled to each of the drain (regions) of the drive transistor DTR1 and the load transistor LTR1. The region coupled thereto functions as another storage node.

Each of the source (regions) of the drive transistors DTR1 and DTR2 is electrically coupled to a GND potential. Each of the source (regions) of the load transistors LTR1 and LTR2 is electrically coupled to a power supply line VCC which applies a voltage Vcc. Each of the other electrodes of the capacitors C1 and C2 is electrically coupled to a Vcc/2 line which applies a voltage Vcc/2 corresponding to ½ of the voltage Vcc. Of the pair of bit lines BL and /BL, the bit line BL is electrically coupled to the drain (region) of the access transistor ATR1 and the bit line /BL is electrically coupled to the drain (region) of the access transistor ATR2.

Figure 2:
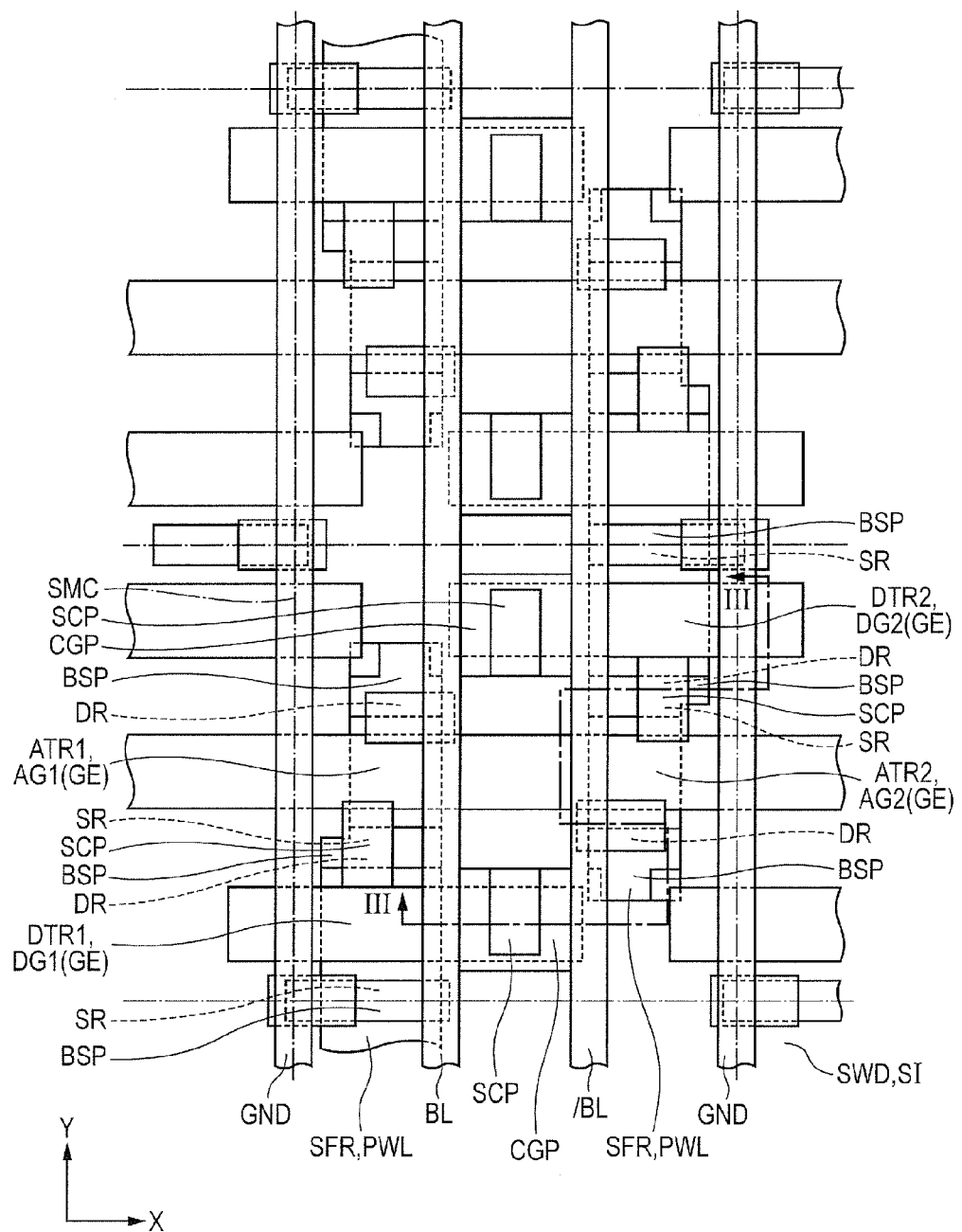
FIG. 2 is a plan view showing a structure of an advanced SRAM memory cell region in a semiconductor device according to Embodiment 1.
Figure 3:
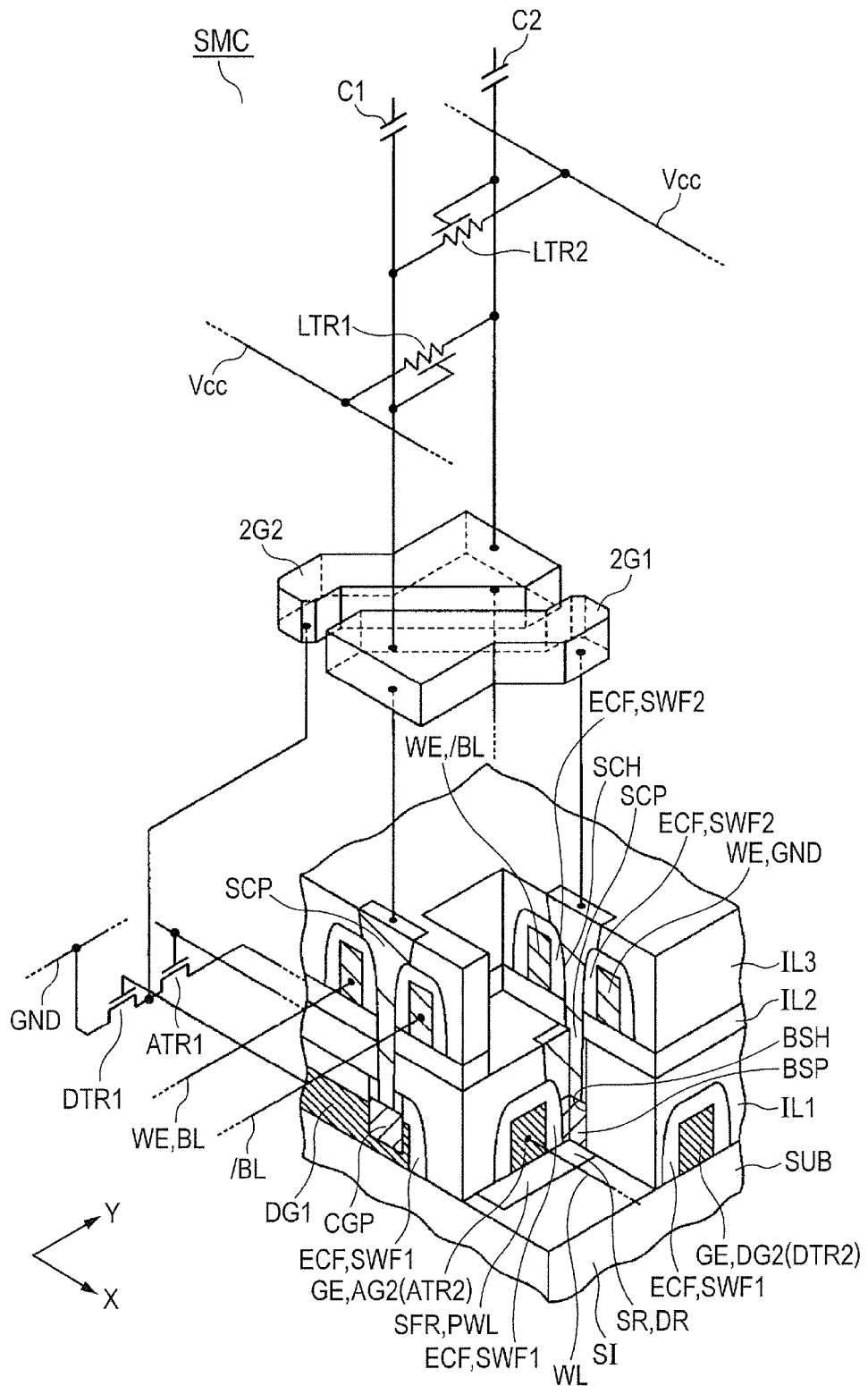
FIG. 3 is a view showing the semiconductor device including the advanced SRAM memory cell in Embodiment 1, which is a perspective view including a partial cross-sectional structure along the sectional line III-III shown in FIG. 2 and an equivalent circuit.

Next, a description will be given of an example of the structure of the semiconductor device including the advanced SRAM memory cell. As shown in FIGS. 2 and 3, in the main surface of a semiconductor substrate SUB, by an isolation insulating film SI, a plurality of element formation regions SFR electrically insulated from each other are defined. In the region (in the dot-dash line rectangle) of one of the SRAM memory cells SMC, the two element formation regions SFR are located. In each of the two element formation regions SFR, a p-well PWL is formed.

In one of the two element formation regions SFR, the drive transistor DTR1 and the access transistor ATR1 are formed. The drive transistor DTR1 includes a source region SR, a drain region DR, and a gate electrode DG1. The access transistor ATR1 includes the source region SR, the drain region DR, and a gate electrode AG1.

The source region SR of the access transistor ATR1 and the drain region DR of the drive transistor DTR1 are formed as a common region in the portion of the element formation region SFR (p-well PWL) interposed between a gate wiring portion GE including the gate electrode AG1 and the gate wiring portion GE including the gate electrode DG1.

The drain region DR of the access transistor ATR1 is electrically coupled to the bit line BL via a polysilicon plug BSP and a plug made of a wiring material. The source region SR of the drive transistor DTR1 is electrically coupled to a ground line GND via the polysilicon plug BSP and a plug made of a wiring material.

The source region SR of the access transistor ATR1 and the drain region DR of the drive transistor DTR1 are electrically coupled to a local line 2G2 (see FIG. 3) via the polysilicon plug BSP (bit-line storage contact plug) as a part of a contact plug and a polysilicon plug SCP (storage node contact plug) as another part of the contact plug. A gate electrode DG2 of the drive transistor DTR2 is electrically coupled to the local line 2G2 (see FIG. 3) via a polysilicon plug CGP and the polysilicon plug SCP.

In the other of the two element formation regions SFR, the drive transistor DTR2 and the access transistor ATR2 are formed. The drive transistor DTR2 includes the source region SR, the drain region DR, and the gate electrode DG2. The access transistor ATR2 includes the source region SR, the drain region DR, and a gate electrode AG2.

The source region SR of the access transistor ATR2 and the drain region DR of the drive transistor DTR2 are formed as a common region in the portion of the element formation region SFR (p-well PWL) interposed between the gate wiring portion GE including the gate electrode AG2 and the gate wiring portion GE including the gate electrode DG2.

The drain region DR of the access transistor ATR2 is electrically coupled to the bit line /BL via the polysilicon plug BSP and a plug made of a wiring material. The source region SR of the drive transistor DTR2 is electrically coupled to the ground line GND via the polysilicon plug BSP and a plug made of a wiring material.

The source region SR of the access transistor ATR2 and the drain region DR of the drive transistor DTR2 are electrically coupled to a local line 2G1 (see FIG. 3) via the polysilicon plug BSP (bit-line storage contact plug) as a part of a contact plug and the polysilicon plug SCP (storage node contact plug) as another part of the contact plug. The gate electrode DG1 of the drive transistor DTR1 is electrically coupled to the local line 2G1 (see FIG. 3) via the polysilicon plugs CGP and SCP.

As shown in FIG. 3, above the local lines 2G1 and 2G2, the load transistors LTR1 and LTR2 are formed and, further above the load transistors LTR1 and LTR2, the capacitors C1 and C2 are formed. The local line 2G1 is electrically coupled to the gate electrode of the load transistor LTR1, the drain region of the load transistor LTR2, and the capacitor C1. The local line 2G2 is electrically coupled to the gate electrode of the load transistor LTR2, the drain region of the load transistor LTR1, and the capacitor C2.

Next, on the basis of FIG. 3, a detailed description will be given of the structures of the polysilicon plugs BSP and SCP which electrically couple each of the source region SR of the access transistor ATR2 (ATR1) and the drain region DR of the drive transistor DTR2 (DTR1) to the local line 2G1 (2G2).

The polysilicon plug BSP is in contact with the source region SR of the access transistor ATR2 and the drain region DR of the drive transistor DTR2. The source region SR and the drain region DR are formed in the portion of the element formation region SFR interposed between the gate wiring portion GE including the gate electrode AG2 and the gate wiring portion GE including the gate electrode DG2. The gate wiring portion GE (AG2) and the gate wiring portion GE (DG2) extend in the X-direction, while being spaced apart from each other in the Y-direction.

In the gate wiring portion GE, wiring covering insulating films ECF including sidewall insulating films SWF1 each made of a silicon nitride film or the like are formed so as to cover the respective side and upper surfaces of the gate electrodes AG2 and DG2. Note that, in FIG. 3, to avoid intricacy of the drawing, the structures of the gate electrodes AG2 and DG2 and the wiring covering insulating films ECF are simplified, but the specific structures thereof will be described later. An interlayer insulating film IL1 made of, e.g., a BPTEOS (Boro Phospho Tetra Ethyl Ortho Silicate) film having an etching property different from that of each of the wiring covering insulating films ECF is formed so as to cover the gate wiring portions GE.

A contact hole BSH is formed to extend through the portion of the interlayer insulating film IL1 located between the two gate wiring portions GE and reach the source region SR and the drain region DR which are located in the portion of the element formation region SFR interposed between the two gate wiring portions GE. The polysilicon plug BSP is formed in the contact hole BSH. The polysilicon plug BSP is formed to have the upper surface lower in level than the gate wiring portions GE. As will be described later, the contact hole BSH is self-alignedly formed by performing etching treatment on the interlayer insulating film IL1, while substantially leaving the wiring covering insulating films ECF each having the etching property different from that of the interlayer insulating film IL1.

An interlayer insulating film IL2 made of, e.g., an NSG (Non-doped Silicate Glass) film is formed so as to cover the interlayer insulating film IL1. Over the interlayer insulating film IL2, a plurality of wiring portions WE including the bit lines BT and /BT and the ground lines GND are formed. The plurality of wiring portions WE extend in the Y-direction (see FIG. 2), while being spaced apart from each other in the X-direction. In the wiring portions WE, the wiring covering insulating films ECF including the sidewall insulating films SWF2 such as silicon nitride films are formed so as to cover the respective side and upper surfaces of the bit lines BT and /BT and the ground lines GND each made of a tungsten film or the like.

An interlayer insulating film IL3 made of, e.g., a BPTEOS film having an etching property different from that of each of the wiring covering insulating films ECF is formed so as to cover the wiring portions WE. In the interlayer insulating films IL3, IL2, and IL1, a contact hole SCH is formed to extend through the portions thereof interposed between the two wiring portions WE and through the portions thereof interposed between the two gate wiring portions GE and reach the polysilicon plug BSP. In the contact hole SCH, the polysilicon plug SCP is formed to come in contact with the polysilicon plug BSP.

As will be described later, the contact hole PSH is self-alignedly formed by performing etching treatment on the interlayer insulating films IL3 and IL2 or the like, while substantially leaving the wiring covering insulating films ECF having the etching properties different from those of the interlayer insulating films IL3, IL2, and IL1 over the wiring portions WE and the gate wiring portions GE. Note that the structures of the polysilicon plugs BSP and SCP described above are also the same with regard to the access transistor ATR1 and the drive transistor DTR1.

The semiconductor device including the SRAM memory cell according to the present embodiment is configured as described above. Next, a description will be given of an example of a manufacturing method of the semiconductor device including the SRAM memory cell described above.

Figure 4:
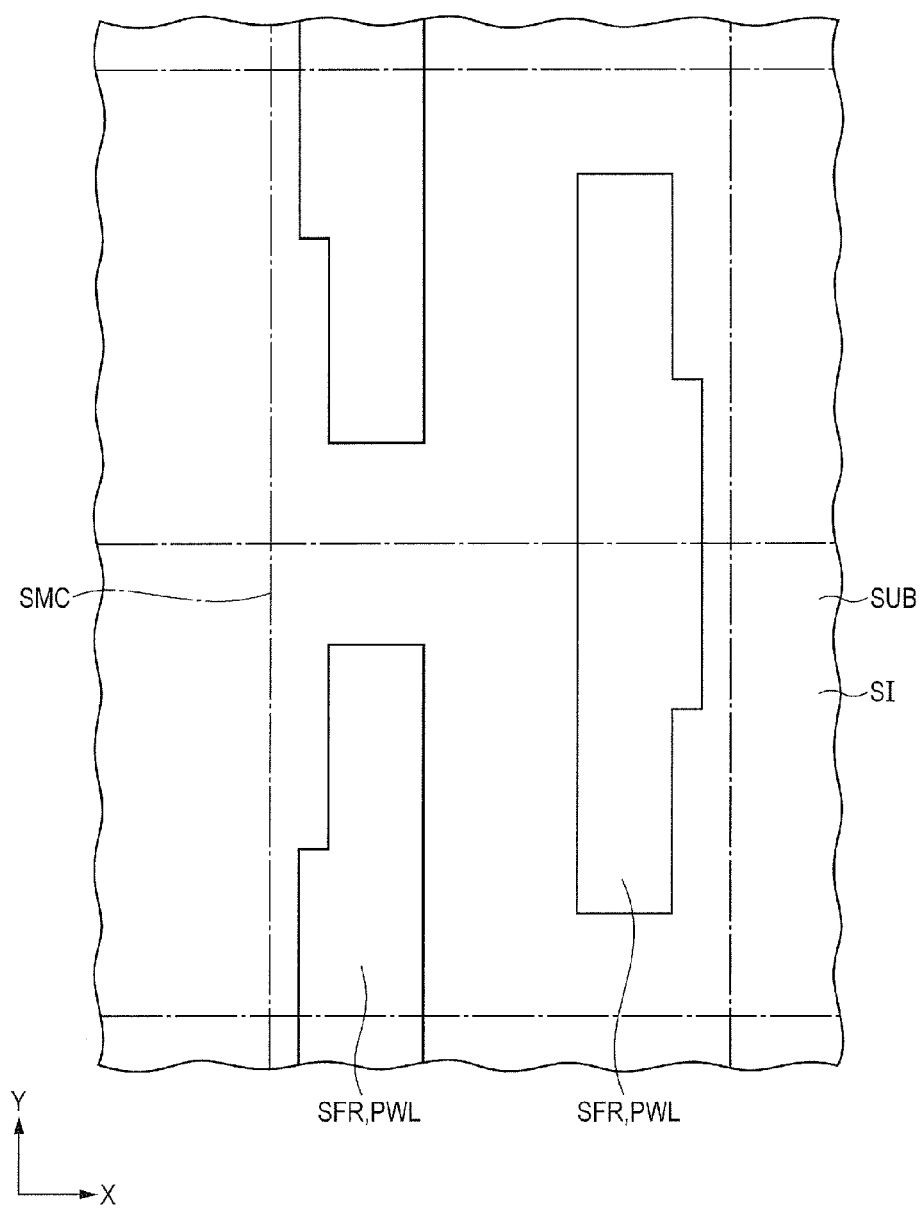
FIG. 4 is a plan view showing a step of a manufacturing method of the semiconductor device including the advanced SRAM memory cell in Embodiment 1.
Figure 5:
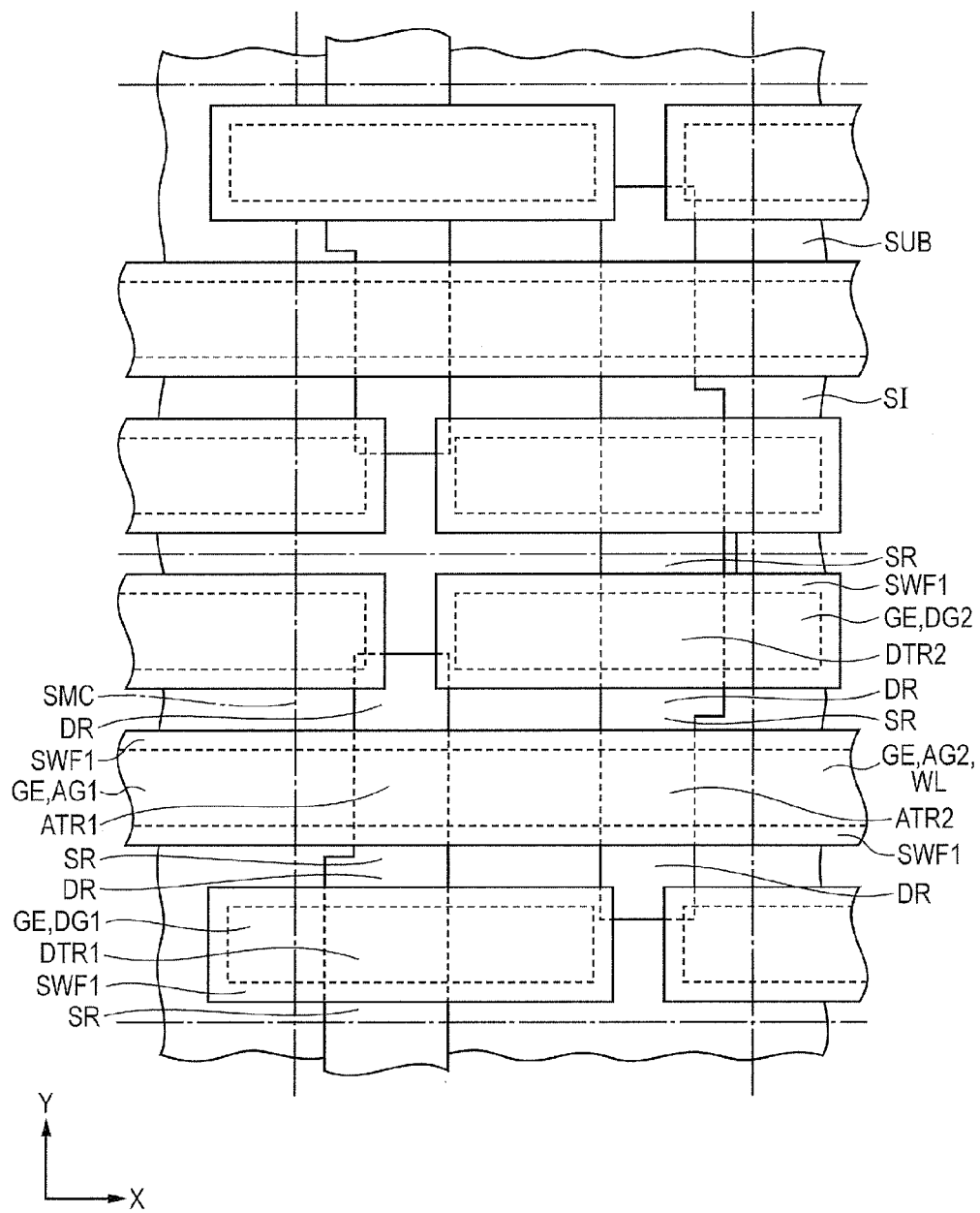
FIG. 5 is a plan view showing the step performed after the step shown in FIG. 4 in Embodiment 1.

First, as shown in FIG. 4, in the main surface of the semiconductor substrate SUB, the isolation insulating film SI is formed to define the element formation regions SFR and, in the element formation regions SFR, the p-wells PWL are formed. Next, as shown in FIG. 5, the plurality of gate wiring portions GE are formed to extend in the X-direction, while being spaced apart from each other in the Y-direction. As the gate wiring portions GE, the gate wiring portion GE including the gate electrode AG1, the gate wiring portion GE including the gate electrode DG1, the gate wiring portion GE including the gate electrode AG2, and the gate wiring portion GE including the gate electrode DG2 are formed. The gate wiring portions GE including the gate electrodes AG1 and AG2 serve as the word lines WL.

Each of the gate electrodes AG1, DG1, AG2, and DG2 is formed by, e.g., successively stacking a doped polysilicon film DP, a tungsten silicide film WS, a TEOS film TE1, and a hard mask insulating film HMF (see FIG. 7) and patterning the stacked films. Over the side-wall surfaces of the gate electrodes AG1, DG1, AG2, and DG2 or the like, the sidewall insulating films SWF1 (see FIG. 7) each including a first side-wall insulating film SW1 made of a silicon dioxide film and a second side-wall insulating film SW2 made of a silicon nitride film are formed.

In the portions of the element formation regions SFR (p-wells PWL) located on one side of the gate electrodes AG1, DG1, AG2, and DG2, the source regions SR are formed. In the portions of the element formation regions SFR (p-wells PWL) located on the other side thereof, the drain regions DR are formed. Thus, in the element formation regions SFR, the access transistors ATR1 and ATR2 and the drive transistors DTR1 and DTR2 are formed.

Figure 6:
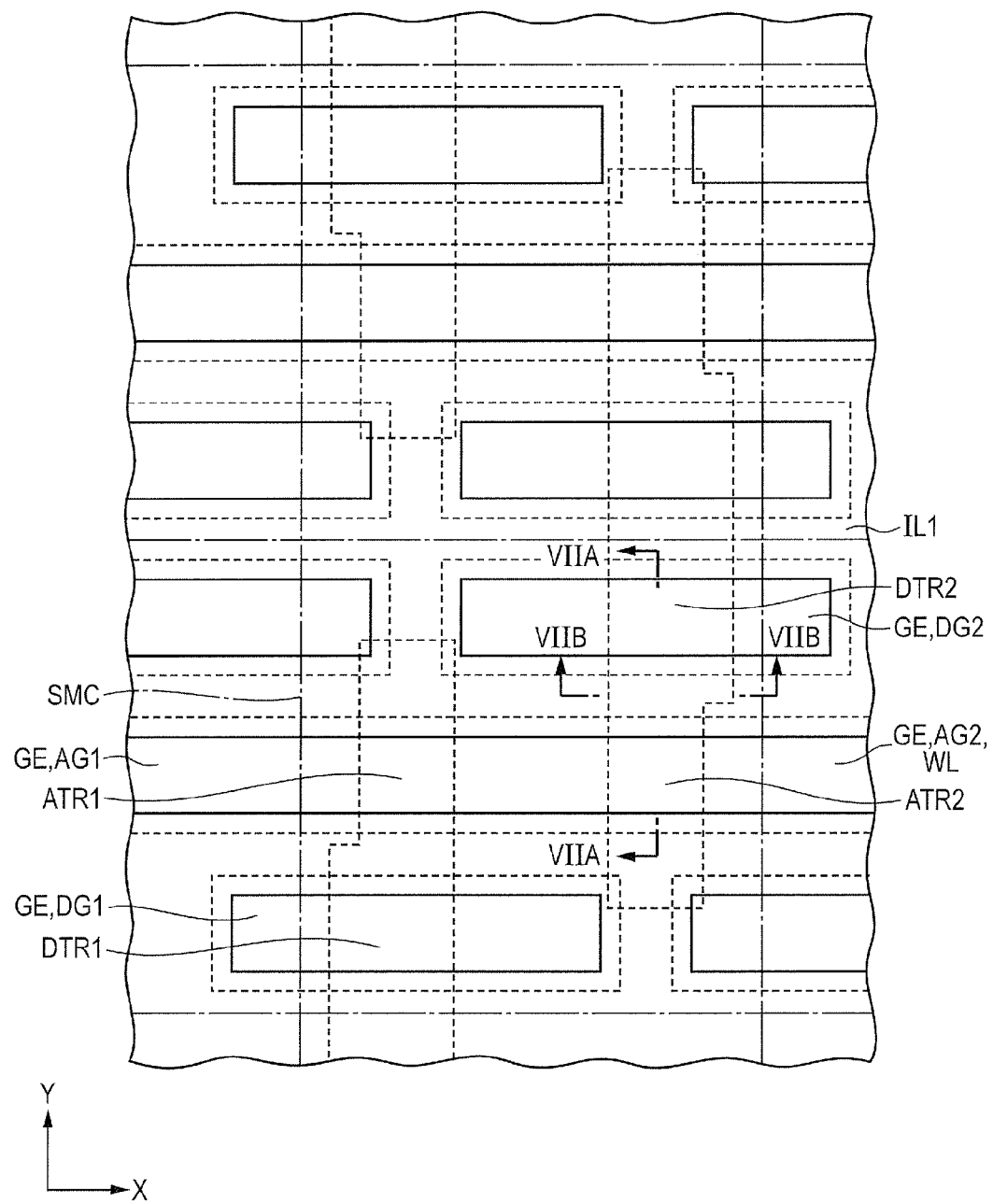
FIG. 6 is a plan view showing the step performed after the step shown in FIG. 5 in Embodiment 1.
Figures 7A, 7B:
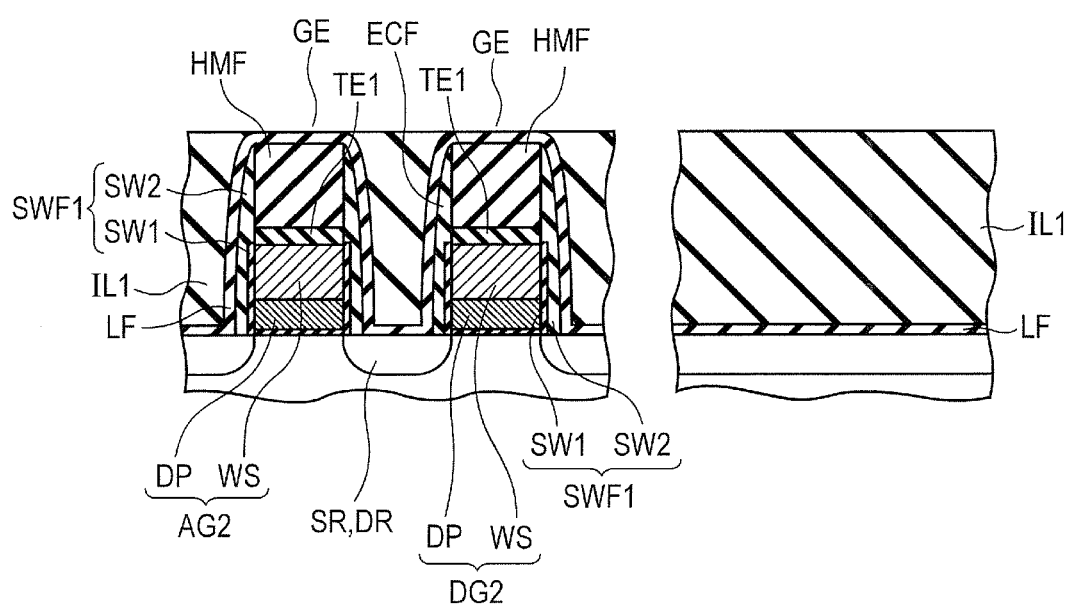

Next, a liner film LF (see FIGS. 7A and 7B) made of, e.g., a silicon nitride film is formed so as to cover the access transistors ATR1 and ATR2, the drive transistors DTR1 and DTR2, and the like. The interlayer insulating film IL1 (see FIG. 7) made of, e.g., a BPTEOS film is formed so as to cover the liner film LF. Then, chemical mechanical polishing treatment (CMP) is performed on the interlayer insulating film IL1 to remove the portions of the interlayer insulating film IL1 located over the upper surfaces of the gate wiring portions GE, while leaving the portions of the interlayer insulating film IL1 interposed between the gate wiring portions GE, as shown in FIGS. 6, 7A, and 7B.

Figure 8:
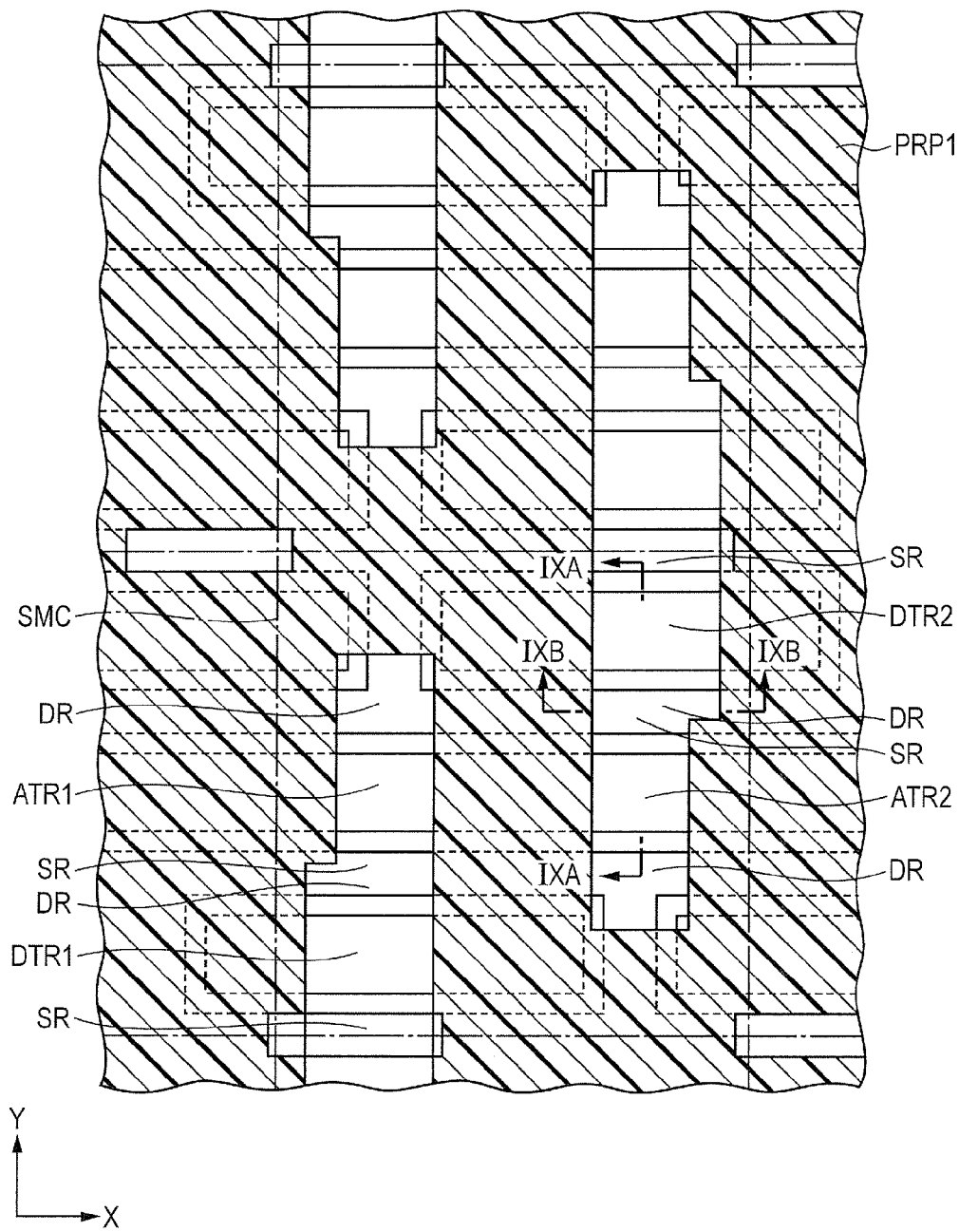
FIG. 8 is a plan view showing the step performed after the step shown in FIG. 6 in Embodiment 1.
Figure 9A:
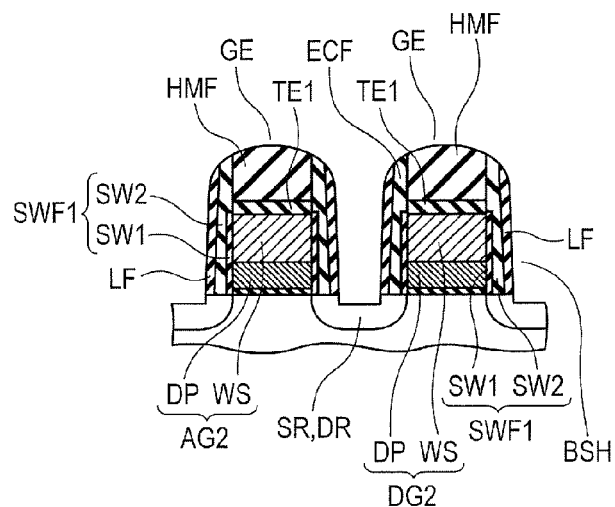
Figure 9B:
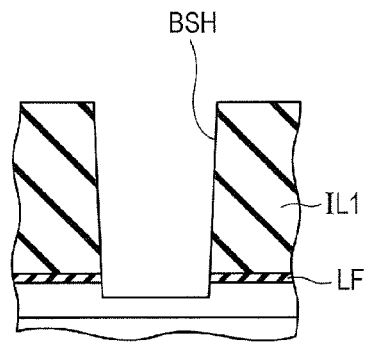

Next, as shown in FIG. 8, predetermined photoengraving treatment is performed to form a resist pattern PRP1 which exposes the regions where the element formation regions are located. Then, using the resist pattern PRP1 as an etching mask, anisotropic etching is performed on the interlayer insulating film IL1 to remove the resist pattern PRP1 and thus form the contact hole BSH (see FIG. 9) exposing the source region SR and the drain region DR, as shown in FIGS. 9A and 9B. At this time, the interlayer insulating film IL1 formed of the TEOS film is etched, while the wiring covering insulating films ECF formed of the silicon nitride films are substantially left.

Figure 10A:
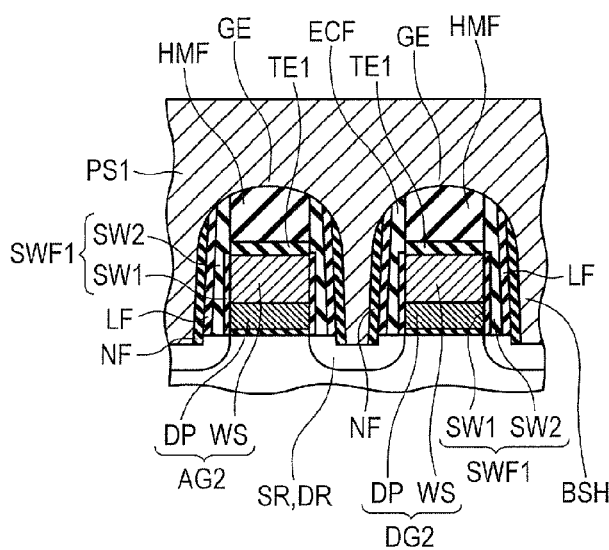
Figure 10B:
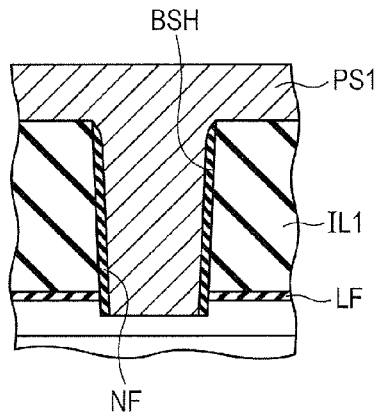

Next, the contact holes (not shown) which expose the gate electrodes DG1 and DG2 of the drive transistors DTR1 and DTR2 are formed. Then, as shown in FIGS. 10A and 10B, over the side-wall surfaces of the contact hole BSH, protective films NF each made of a silicon nitride film are formed and, subsequently, a polysilicon film PS1 is formed so as to be embedded in the contact hole BSH. At this time, in each of the contact holes exposing the gate electrodes DG1 and DG2 also, the polysilicon film PS1 is formed.

Figure 11A:
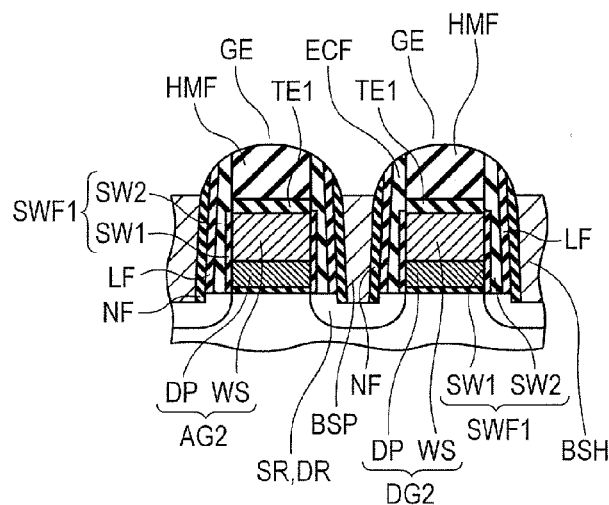
Figure 11B:
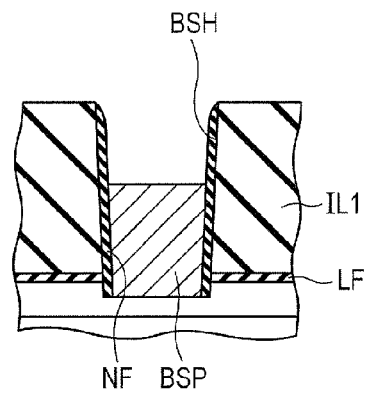

Next, etching treatment is performed on the entire surface of the polysilicon film PS1 to remove the portion of the polysilicon film PS1 located over the upper surface of the interlayer insulating film IL1 and a part of the polysilicon film PS1 located in the contact hole BSH or the like. As a result, as shown in FIGS. 11A and 11B, in the contact hole BSH, the polysilicon plug BSP is formed. At this time, the silicon plug BSP is formed to have the upper surface lower in level than the gate wiring portions GE. In each of the contact holes exposing the gate electrodes DG1 and DG2, the polysilicon plug CGP (see FIG. 2 or 3) is formed.

Figure 12A:
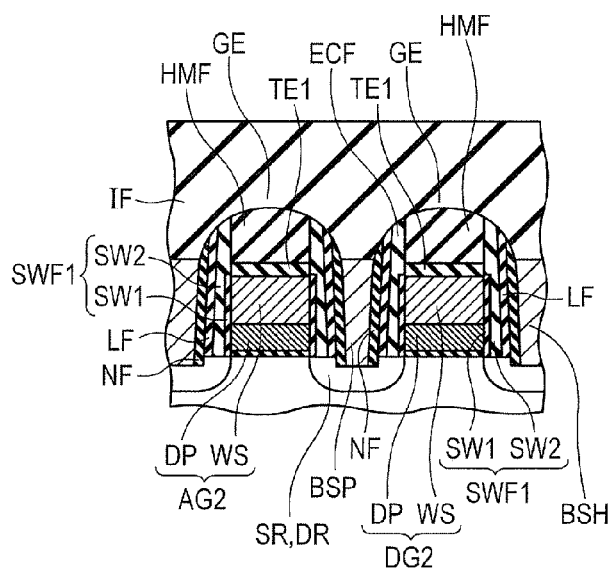
Figure 12B:
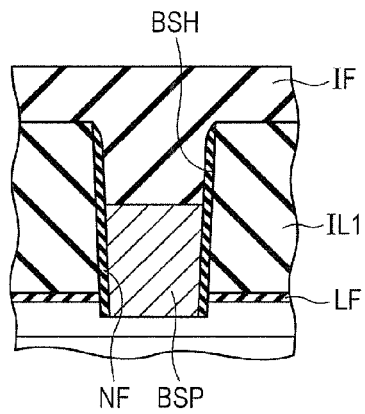
Figure 13A:
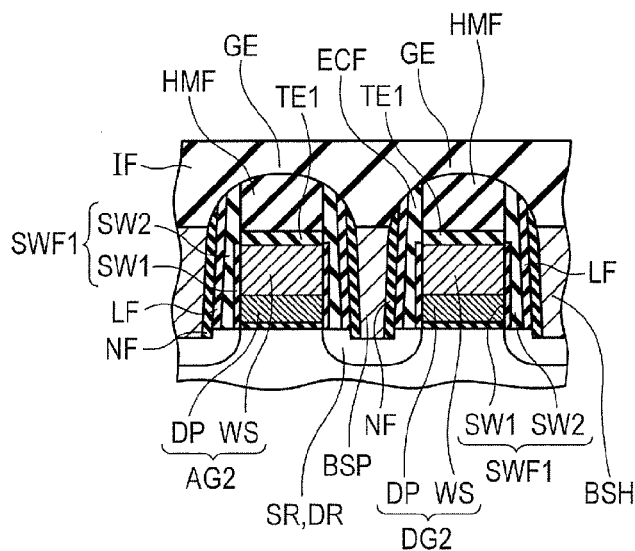
Figure 13B:
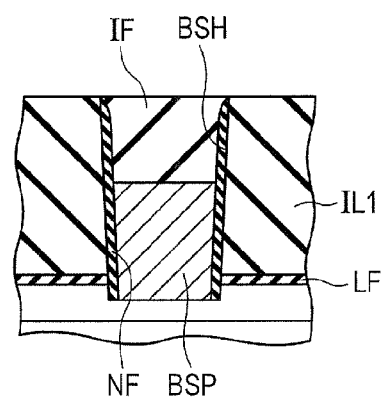
Figure 14A:
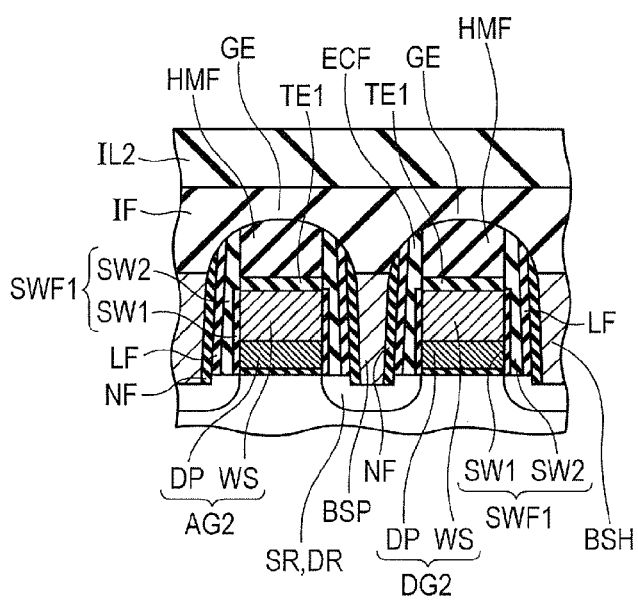
Figure 14B:
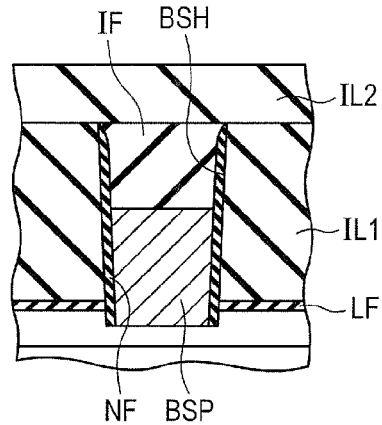

Next, as shown in FIGS. 12A and 12B, an insulating film IF made of, e.g., a PSG (Phospho Silicate Glass) film is formed so as to be embedded in the contact hole BSH. Then, chemical mechanical polishing treatment is performed on the insulating film IF to remove the portion of the insulating film IF located over the upper surface of the interlayer insulating film IL1, while leaving the portion of the insulating film IF located in the contact hole BSH. Then, as shown in FIGS. 14A and 14B, the interlayer insulating film IL2 made of, e.g., an NSG film is formed so as to cover the interlayer insulating film IL1 and the insulating film IF.

Figure 15A:
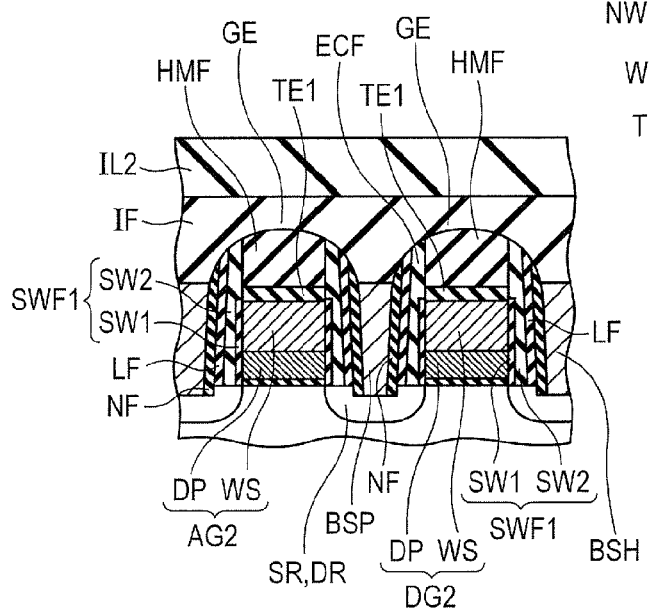
Figure 15B:
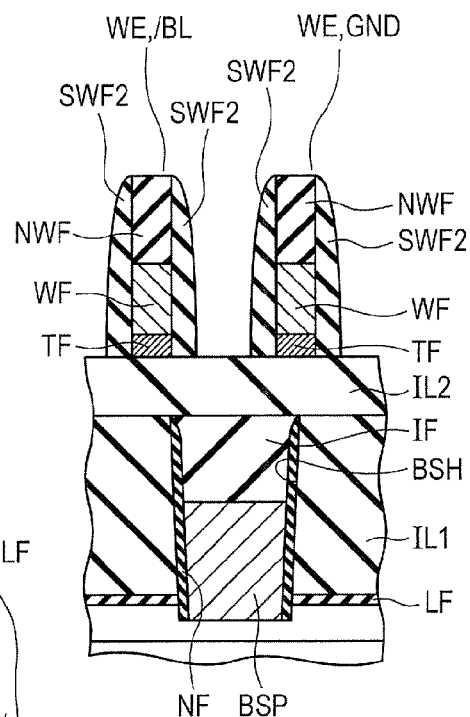

Next, as shown in FIGS. 15A and 15B, over the interlayer insulating film IL2, the wiring portions WE including the bit lines BL and /BL and the ground lines GND are formed. The wiring portions WE are formed by, e.g., successively stacking a titanium (Ti) film, a titanium nitride (TiN) film, a tungsten (W) film WF, and an insulating film NWF made of a silicon nitride film and patterning the stacked films. Note that, in the drawing, the titanium (Ti) film and the titanium nitride (TiN) film are shown as a single-layer titanium film TF. Next, over the side-wall surfaces of the titanium film TG, the tungsten film WF, and the like, the sidewall insulating films SWF2 each made of, e.g., a silicon nitride film are formed.

Figure 17:
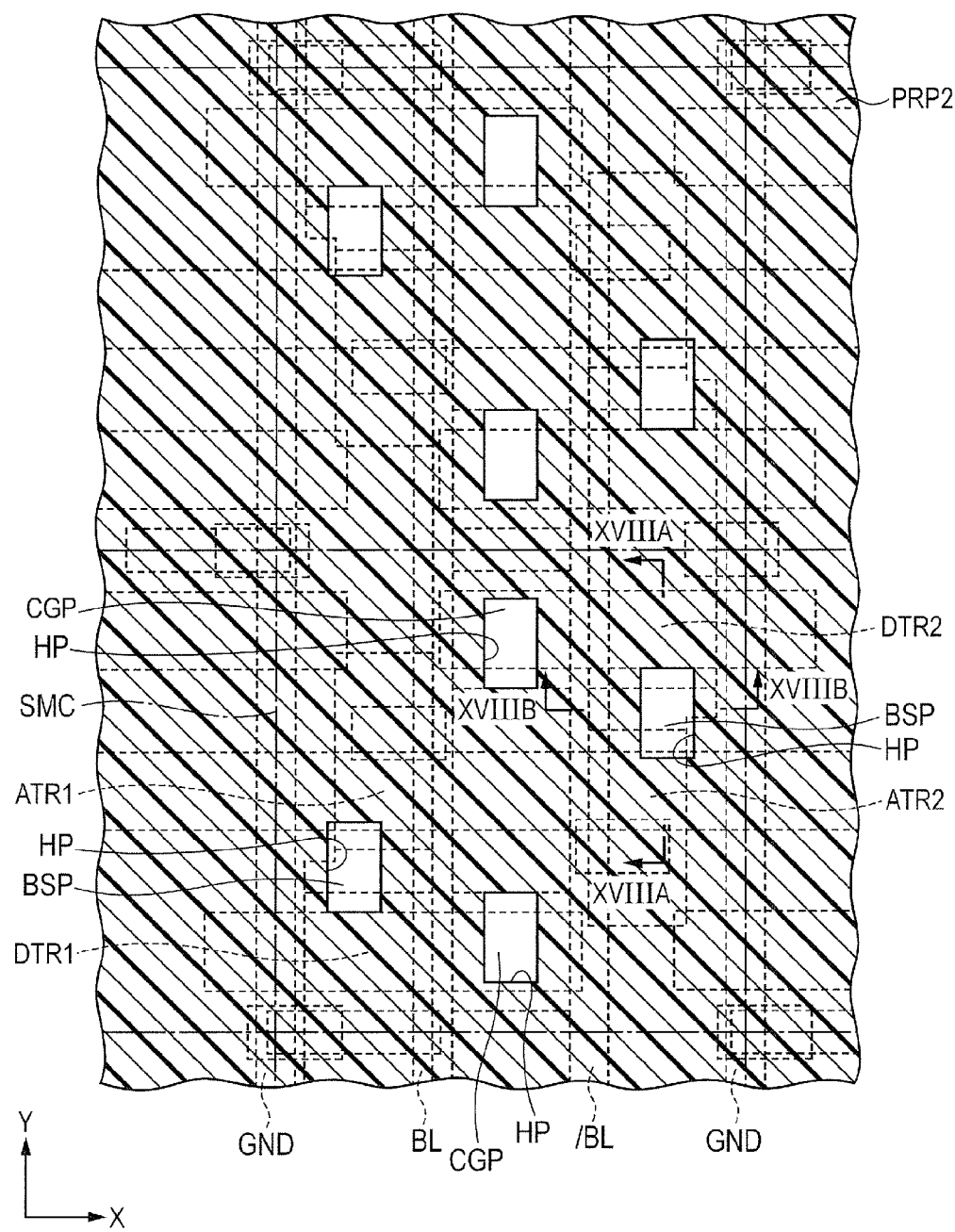
FIG. 17 is a plan view showing the step performed after the step shown in FIG. 16 in Embodiment 1.

Next, as shown in FIGS. 16A and 16B, the interlayer insulating film IL3 made of, e.g., a BPTEOS film is formed so as to cover the wiring portions WE. Then, as shown in FIGS. 17, 18A, and 18B, predetermined photoengraving treatment is performed to form a resist pattern PRP2 for forming contact holes which has openings HP exposing the interlayer insulating film IL3.

Figure 19A:
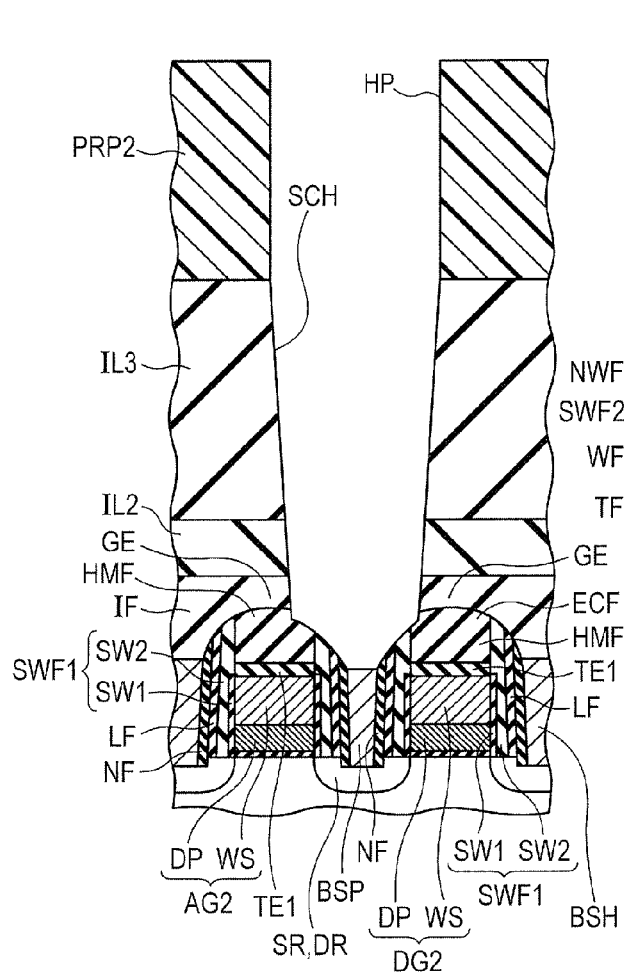
Figure 19B:
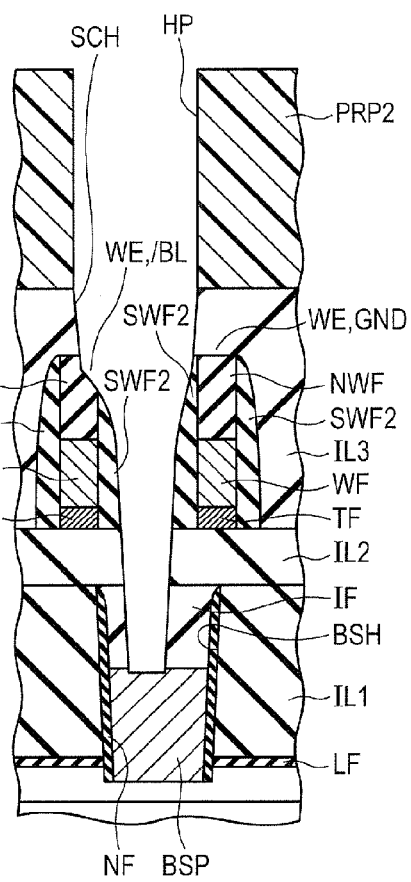

Next, as shown in FIGS. 19A and 19B, using the resist pattern PRP2 as an etching mask, anisotropic etching is performed on the interlayer insulating films IL3 and IL2 and the insulating film IF to form the contact hole SCH which exposes the polysilicon plug BSP. At this time, the interlayer insulating film IL3 formed of the BPTEOS film is etched, while the sidewall insulating films SWF2 each formed of the silicon nitride film and the like are substantially left. Also, the insulating film IF formed of the PSG film is etched, while the wiring covering insulating films ECF each formed of the silicon nitride film are substantially left. Thus, the contact hole SCH is formed in the interlayer insulating films IL3 and IL2 and the insulating film IF in self-aligned relation with the wiring portions WE located in the upper layer and the gate wiring portions GE located in the lower layer.

Figure 20A:
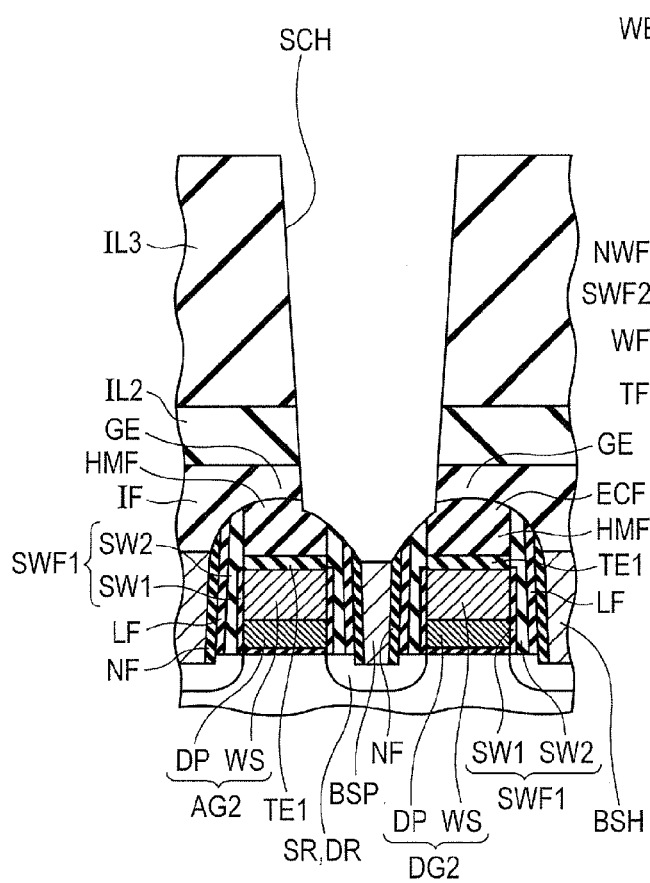
Figure 20B:
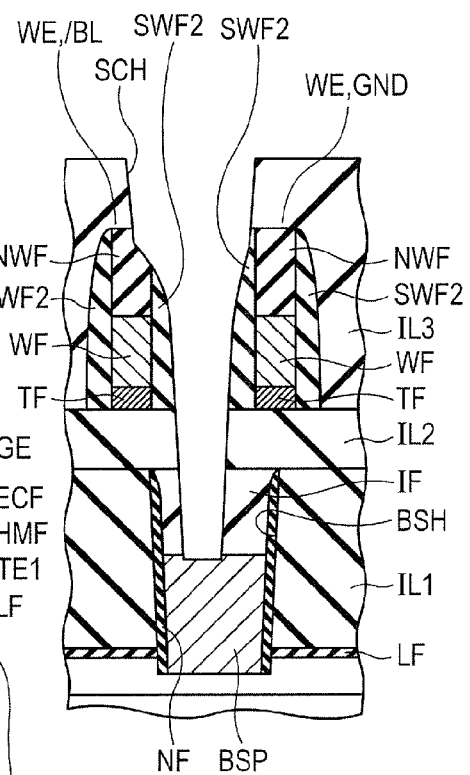
Figure 21A:
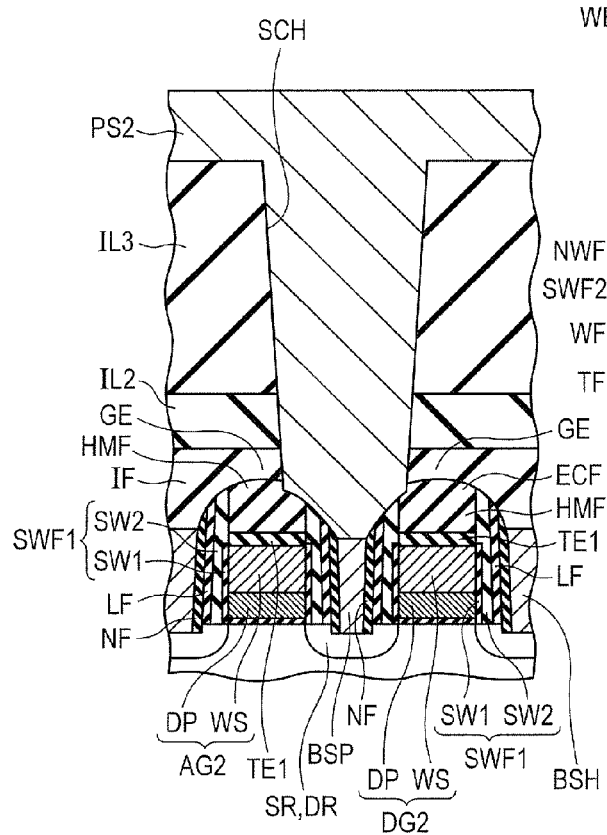
Figure 21B:
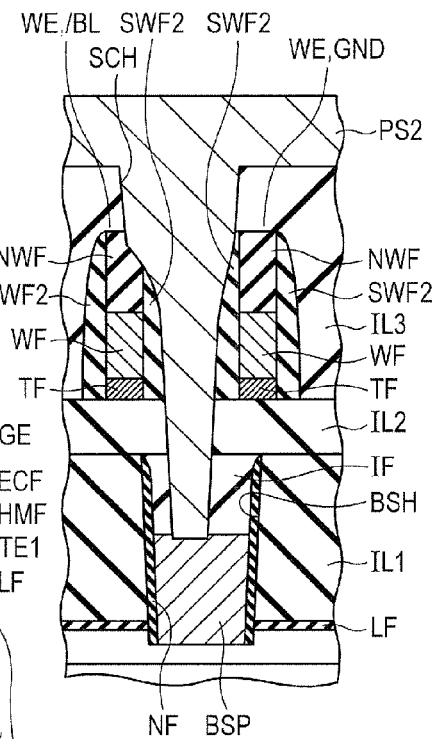
Figure 22A:
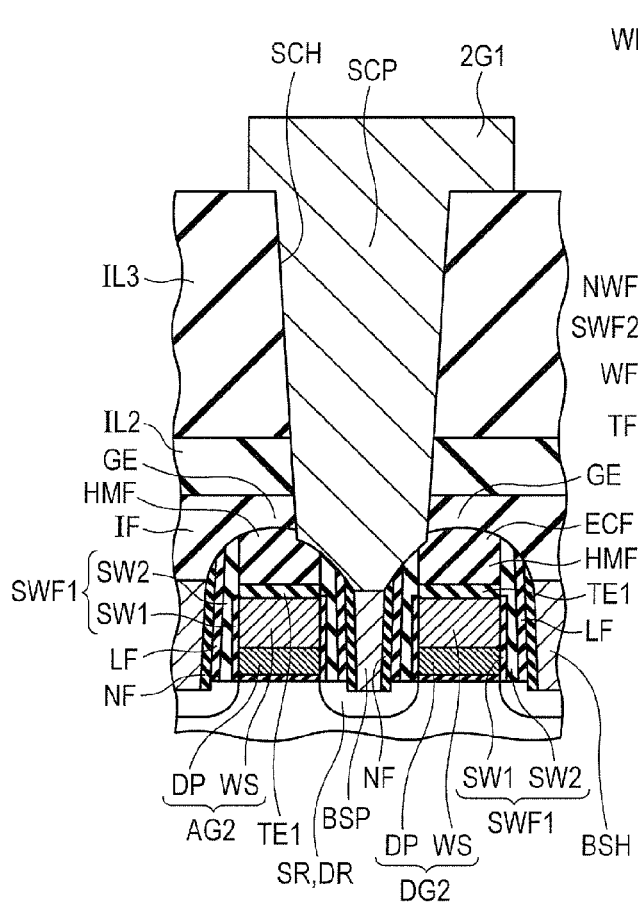
Figure 22B:
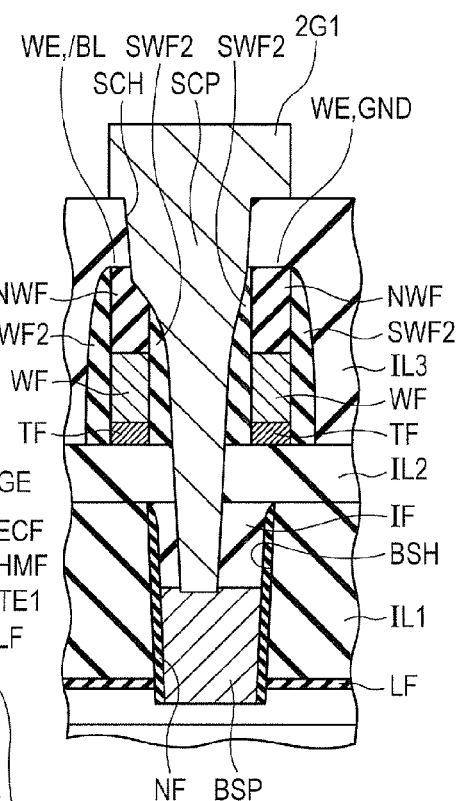

Next, as shown in FIGS. 20A and 20B, the resist pattern PRP2 is removed to expose the interlayer insulating film IL3. Then, as shown in FIGS. 21A and 21B, a polysilicon film PS2 having a predetermined thickness is formed so as to be embedded in the contact hole SCH. Next, predetermined photoengraving treatment is performed to form a resist pattern (not shown) for forming the local lines. Then, using the resist pattern as an etching mask, etching treatment is performed on the polysilicon film PS2 to remove the resist pattern and thus form the local lines 2G1 and 2G2 (see FIG. 3), as shown in FIGS. 22A and 22B.

Thereafter, the interlayer insulating film (not shown) covering the local lines 2G1 and 2G2, the load transistors LTR1 and LTR2, the capacitors C1 and C2 (see FIG. 3), and the like are formed to complete the main portion of the semiconductor device including the SRAM memory cell SMC.

In the semiconductor device described above, by forming the contact hole SCH in which the polysilicon plug SCP is to be formed in the interlayer insulating films IL3 and IL2 and the insulating film IF in self-aligned relation with the wiring portions WE in the upper layer and the gate wiring portions GE in the lower layer which intersect each other, variations in the contact area between the polysilicon plug SCP and the polysilicon plug BSP are suppressed to allow fluctuations in contact resistance to be suppressed. A description will be given thereof in relation to a semiconductor device according to a comparative example.

In the semiconductor device according to the comparative example, it is assumed that, to provide a simplified description by avoiding a duplicate statement, the description will be given, while showing cross-sectional views corresponding to FIGS. 9A and 9B and the like. It is also assumed that, for the same members as those of the semiconductor device according to the embodiment, reference numerals each headed by "C" are used and a description thereof will not be repeated, unless necessary.

First, an isolation formation region is defined in the top surface of a semiconductor substrate CSUB. Then, as shown in FIGS. 23A and 23B, gate wiring portions CGE are formed. A liner film CLF1 is formed so as to cover the gate wiring portions CGE. Then, an interlayer insulating film CIL1 made of a BPTEOS film is formed so as to cover the gate wiring portions CGE. Subsequently, predetermined photoengraving treatment is performed to form a resist pattern (not shown) for forming a contact hole CBSH (see FIG. 24).

Next, using the resist pattern as an etching mask, etching treatment is performed on the interlayer insulating film CIL1. Then, the resist pattern is removed to form the contact hole CBSH which exposes a source region CSD and a drain region CDR, as shown in FIGS. 24A and 24B. Then, a polysilicon film (not shown) is formed so as to be embedded in the contact hole CBSH. Subsequently, chemical mechanical polishing treatment is performed on the polysilicon film to remove the portion of the polysilicon film located over the upper surface of the interlayer insulating film CIL1, while leaving the portion of the polysilicon film located in the contact hole CBSH. Thus, as shown in FIGS. 25A and 25B, a polysilicon plug CBSP is formed.

Next, as shown in FIGS. 26A and 26B, an interlayer insulating film CIL2 made of an NSG film is formed so as to cover the polysilicon plug CBSP. Then, over the interlayer insulating film CIL2, wiring portions CWE including bit lines CBL and C/BL and ground lines CGND are formed. Then, a liner film CLF2 is formed so as to cover the wiring portions CWE. Subsequently, an interlayer insulating film CIL3 (see FIG. 27) is formed so as to cover the wiring portions CWE.

Next, a resist pattern (not shown) for forming a contact hole CSCH (see FIG. 27) is formed. At this time, to the hole pattern in the resist formed in advance, a water-soluble organic material which is thermally cured by an acidic component in the resist is applied. Then, the organic material is thermally cured by heat treatment. Subsequently, the portion of the organic material that has not been cured is removed using pure water or the like. As a result, a cured resin layer is exposed at the inner wall of the hole pattern in the resist. As the hole pattern in the resist, a hole pattern smaller in size than the initial hole pattern is consequently formed. Note that the process is referred to as RELACS (Resolution Enhancement Lithography Assisted by Chemical Shrink).

Then, using the resist pattern as a mask, anisotropic etching treatment is performed on the interlayer insulating films CIL3 and CIL2. By removing the resist pattern, as shown in FIGS. 27A and 27B, the contact hole CSCH which exposes the polysilicon plug CBSP is formed. Then, a polysilicon film (not shown) is formed so as to be embedded in the contact hole CSCH. Subsequently, predetermined photoengraving treatment is performed to form a resist pattern (not shown) for forming local lines.

Next, using the resist pattern as an etching mask, anisotropic etching treatment is performed on the polysilicon film to remove the resist pattern. Thus, as shown in FIGS. 28A and 28B, a local line C2G1 and the like are formed. Then, the interlayer insulating film covering the local line C2G1 and the like, load transistors, capacitors, and the like (each of which is not shown) are formed to complete the main portion of the semiconductor device including the SRAM memory cell according to the comparative example.

In the semiconductor device according to the comparative example, in the photoengraving treatment for forming the contact hole CSCH, microfabrication (RELACS process) for reducing the size of the hole pattern in the resist is performed. That is, as shown in FIG. 29B, a process is performed in which the hole pattern in the resist formed in advance is reduced in size by ensuring a distance CLE4 between the contact hole formed in the region interposed between the individual wiring portions CWE and each of the wiring portions CWE so as not to expose the wiring portions CWE and the like in the contact hole.

In recent years, to respond to the increasing miniaturization of semiconductor devices, a reduction in the size of a contact hole has also been required. To respond to such a size reduction, a further reduction in the size of a hole pattern in a resist formed in advance has been required. To resolve the image of the hole pattern of the resist, exposure light passing through the hole pattern in a photomask to irradiate the resist is required to have a predetermined light intensity. As a result, in the photomask, a hole pattern of a size based on optical calculation of such exposure light is formed.

In the case of the contact hole formed between the wiring portions CWE, in the hole pattern in the photomask, there is a limit to the space between the wiring portions CWE. Accordingly, when the predetermined intensity of the exposure light is to be ensured, it is necessary to ensure a length for the contact hole in a direction in which each of the wiring portions CWE extends. Consequently, in the contact hole CSCH formed using such a photomask, as shown in FIG. 29A, a length CLE1 in the direction in which the wiring portion CWE extends is increased undesirably.

As a result, a distance CLE3 between the polysilicon plug CBSP located adjacent to the polysilicon plug CBSP to be originally coupled and the contact hole CSCH is reduced and the risk of an electrical short circuit between the polysilicon plug CBSP and a polysilicon plug CSCP to be formed in the contact hole CSCH is assumed.

In addition, a shift in alignment may cause variations in a length CLE2 of the polysilicon plug CBSP exposed at the bottom of the contact hole CSCH to result in variations in the contact area between the polysilicon plug CBSP and the polysilicon plug CSCP formed in the contact hole CSCH. As a result, fluctuations in the contact resistance between the polysilicon plug CBSP and the polysilicon plug CSCP (see FIG. 28) are assumed.

Figure 30A:
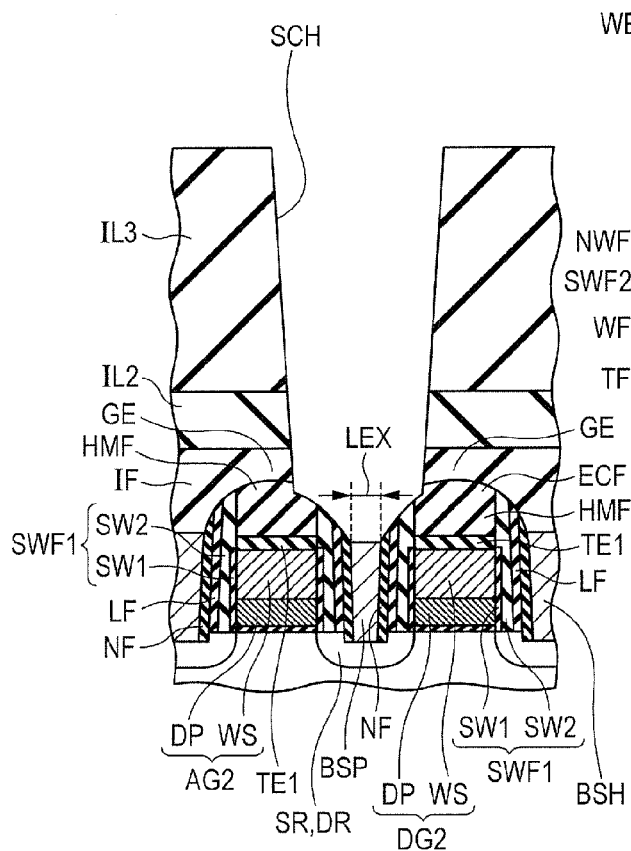
Figure 30B:
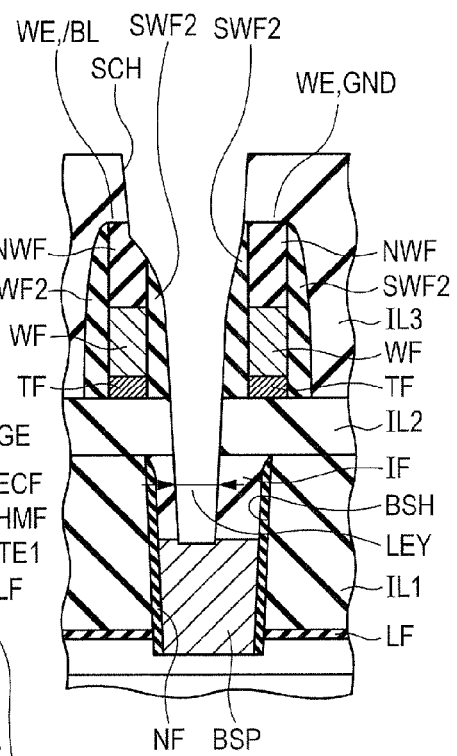

In the contact hole SCH in the semiconductor device according to the embodiment in contrast to the semiconductor device according to the comparative example, etching treatment is self-alignedly performed first on the respective portions of the interlayer insulating films IL3 and IL2 and the insulating film IL which are interposed between the two wiring portions WE extending in the Y-direction, while being spaced apart from each other in the X-direction. As a result, as shown in FIG. 30B, a length LEX of the contact hole SCH in the X-direction is controlled.

In addition, etching treatment is self-alignedly performed on the portion of the insulating film IL which is interposed between the two gate wiring portions GE extending in the X-direction, while being spaced apart from each other in the Y-direction. As a result, as shown in FIG. 30A, a length LEY of the contact hole SCH in the Y-direction is controlled. In this manner, each of the lengths of the bottom portion of the contact hole SCH in the X-direction and the Y-direction are controlled.

Figure 31A:
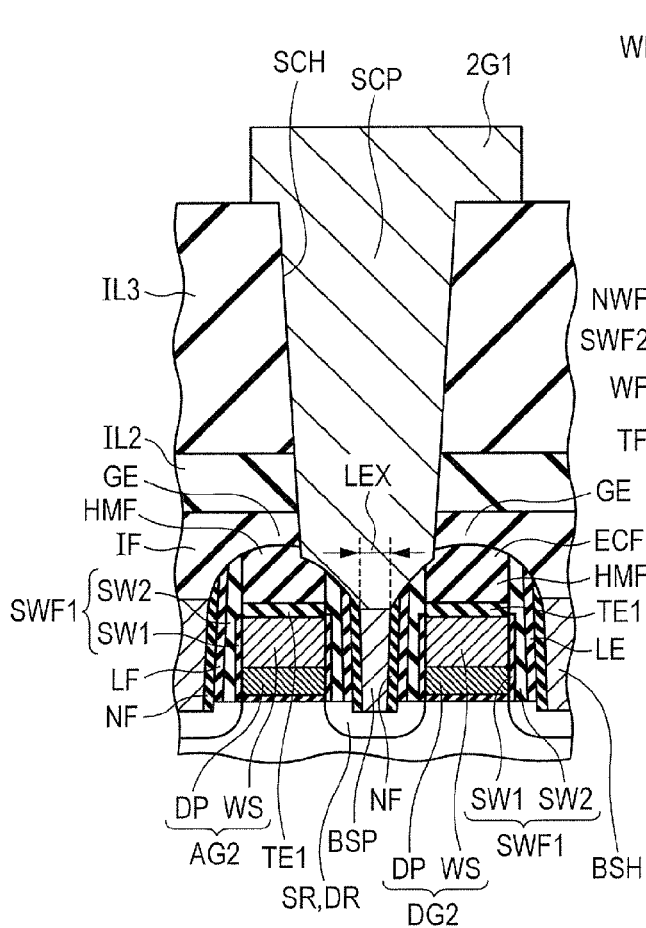
Figure 31B:
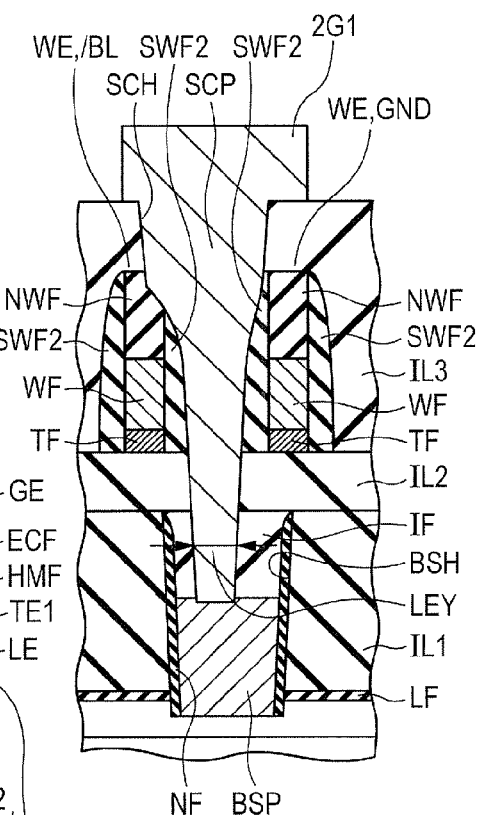

Thus, as shown in FIGS. 31A and 31B, the length LEX of the bottom portion of the polysilicon plug SCP in contact with the polysilicon plug BSP in the X-direction and the length LEY thereof in the Y-direction are controlled and variations in the contact area between the polysilicon plug BSP and the polysilicon plug SCP are suppressed to allow fluctuations in contact resistance to be suppressed.

Moreover, since the length of the polysilicon plug SCP in the Y-direction can be controlled using the space between the two wiring portions WE and the length thereof in the X-direction can be controlled using the space between the two gate wiring portions GE, the size of the hole pattern of the resist can be maximized in the limited region between the two lines compared to that in the case where the RELAC treatment according to the comparative example is performed. As a result, the contact resistance can be reduced to be lower than in the case of the comparative example. In addition, the flexibility of the size of the hole pattern can also be increased to be higher than in the case of the comparative example to allow the solution of such a problem as the joining of the adjacent hole patterns when the hole pattern in a photomask is designed.

Furthermore, by forming the polysilicon plug BSP such that the upper surface thereof is lower in level than the gate wiring portions GE, it is possible to reliably prevent the polysilicon plug SCP from coming in contact with the polysilicon plug BSP located adjacent to the polysilicon plug BSP to be originally coupled.

Embodiment 2

Here, as another example of the semiconductor device, a semiconductor device including an SRAM memory cell will be described in which electrical insulation between a polysilicon plug and wiring portions or gate wiring portions can further be enhanced.

Figure 32:
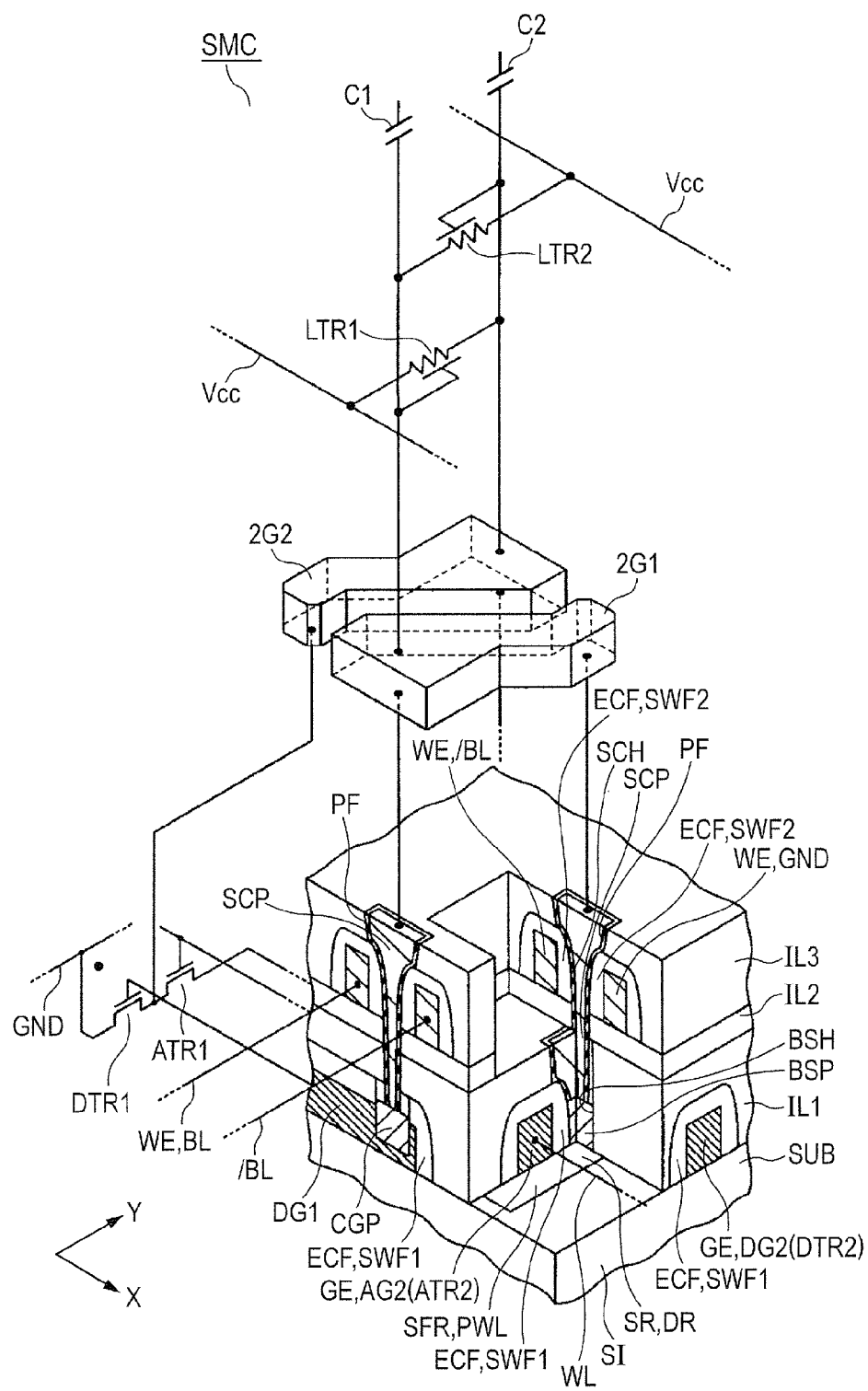
FIG. 32 is a view showing a semiconductor device including an advanced SRAM memory cell according to Embodiment 2, which is a perspective view including a partial cross-sectional structure along a sectional line corresponding to the sectional line III-III shown in FIG. 2 and an equivalent circuit.

As shown in FIG. 32, protective films PF each made of, e.g., a silicon nitride film are formed so as to cover the sidewall surfaces of the contact hole SCH. In the contact hole SCH formed with the protective films PF, the polysilicon plug SCP is formed. The configuration is otherwise the same as that of the semiconductor device shown in FIG. 3 so that the same members are designated by the same reference numerals and a description thereof will not be repeated, unless necessary.

Next, a description will be given of an example of a manufacturing method of the semiconductor device including the SRAM memory cell described above. After the same steps as shown in FIGS. 4 to 19A and 19B are performed, the resist pattern is removed. As a result, as shown in FIGS. 33A and 33B, the contact hole SCH which exposes the polysilicon plug BSP is formed in the portions of the interlayer insulating film IL3 and the like in self-aligned relation with the two wiring portions WE and the two gate wiring portions GE.

Figure 34A:
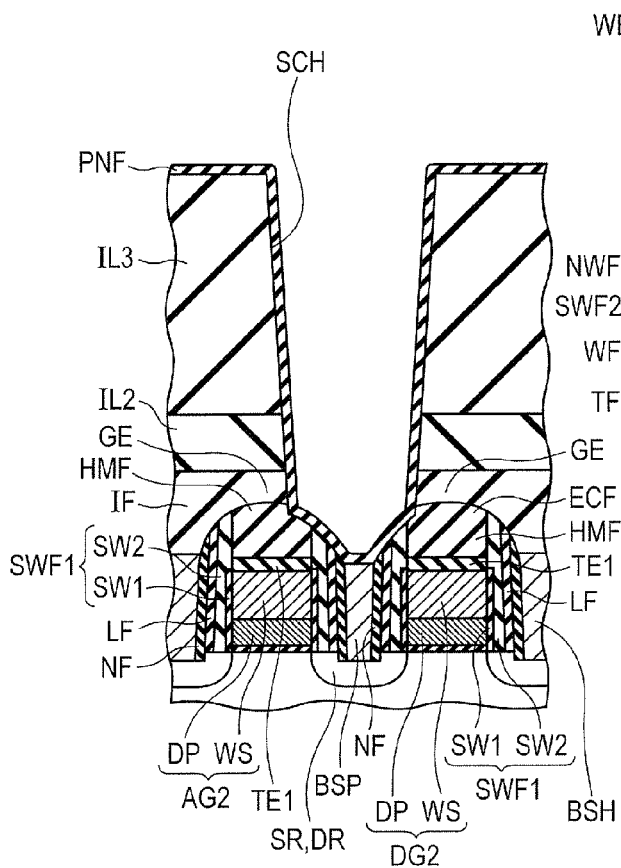
Figure 34B:
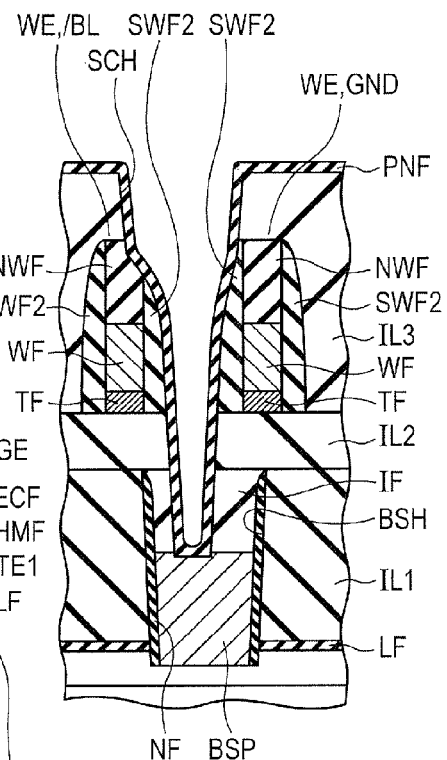

Next, as shown in FIGS. 34A and 34B, a silicon nitride film PNF is formed so as to cover the exposed surface including the side-wall surfaces of the contact hole SCH. Subsequently, anisotropic etching is performed on the entire surface of the silicon nitride film PNF to remove the portion of the silicon nitride film PNF located over the top surface of the polysilicon plug BSP and the portion thereof located over the upper surface of the interlayer insulating film IL3, while leaving the portions of the silicon nitride film PNF located over the sidewall surfaces of the contact hole SCH, as shown in FIGS. 35A and 35B. The portions of the silicon nitride film PNF left over the side-wall surfaces of the contact hole SCH serve as the protective films PF.

Figure 36A:
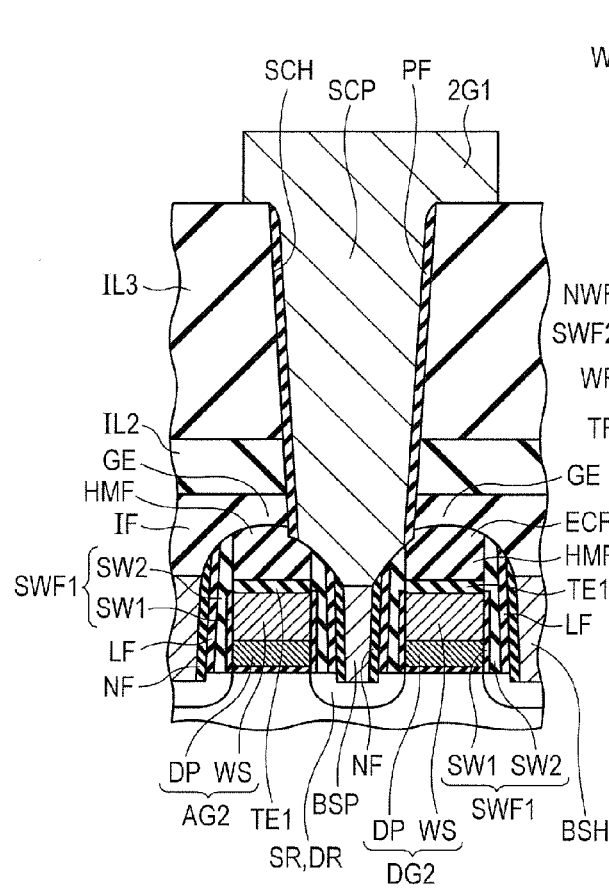
Figure 36B:
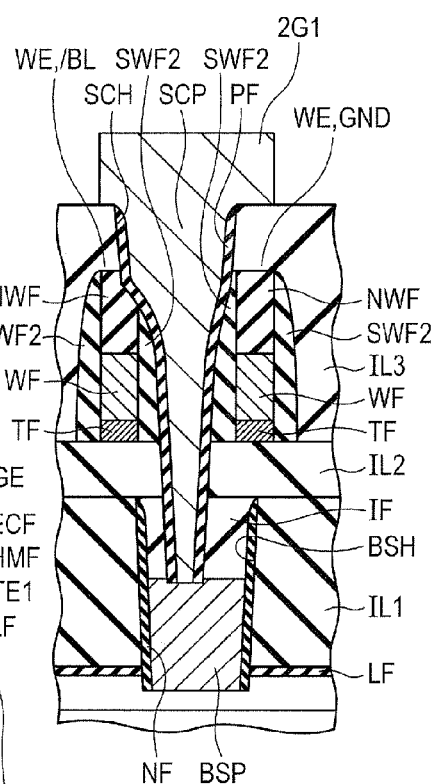

Next, in the same manner as in the step shown in FIGS. 21A and 21B, a polysilicon film having a predetermined thickness is formed so as to be embedded in the contact hole SCH. Subsequently, predetermined photoengraving treatment is performed to form a resist pattern (not shown) for forming local lines. Then, using the resist pattern as an etching mask, etching treatment is performed on the polysilicon film to remove the resist pattern and thus form the local lines 2G1 and 2G2 (see FIG. 3), as shown in FIGS. 36A and 36B.

Thereafter, the interlayer insulating film covering the local lines 2G1 and 2G2, the load transistors LTR1 and LTR2, the capacitors C1 and C2 (see FIG. 3), and the like are formed to complete the main portion of the semiconductor device including the SRAM memory cell SMC.

In the semiconductor device described above, not only the effect described in Embodiment 1 is achieved, but also electrical insulation between the polysilicon plug SCP and the wiring portions WE or the gate wiring portions GE can be enhanced. A specific description will be given thereof.

The interlayer insulating film IL3 or the like and the insulating film IF are silicon oxide films such as BPTEOS films, while the sidewall insulating films SWF2 and SWF1 or the like are silicon nitride films. Consequently, the interlayer insulating film IL3 or the like and the sidewall insulating films SWF2 and SWF1 or the like have different etching properties under the same etching conditions. However, in spite of the different etching properties, when etching treatment is performed on the interlayer insulating film IL3 or the like and the insulating film IF, it is not that the sidewall insulating films SWF2 and SWF1 or the like are not etched at all, but the sidewall insulating films SWF2 and SWF1 or the like may be etched to a degree.

In the semiconductor device described above, even when the sidewall insulating films SWF2 and SWF1 or the like are etched to a degree when the contact hole SCH is formed, the protective films PF each made of a silicon nitride film are formed over the side-wall surfaces of the contact hole SCH. As a result, the bit lines BT and /BT or the like are covered with the protective films PF and the gate electrodes AG2 and DG2 or the like are covered with the protective films PF.

This reliably prevents an electrical short circuit between the polysilicon plug SCP formed in the contact hole SCH and the bit lines BT and /BT or the like and can enhance the electrical insulation between the polysilicon plug SCP and the bit lines BT and /BT or the like. This also reliably prevents an electrical short circuit between the polysilicon plug SCP and the gate electrodes AG2 and DG2 or the like and can enhance the electrical insulation between the polysilicon plug SCP and the gate electrodes AG2 and DG2 or the like.

In the semiconductor device according to each of the embodiments, the contact hole SCH is self-alignedly formed by performing etching treatment first on the portions of the interlayer insulating film IL3 and the like which are interposed between the two wiring portions WE extending in the Y-direction, while being spaced apart from each other in the X-direction. As a result, the polysilicon plug SCP formed in the contact hole SCH has a shape (in a direction orthogonal to the wiring portions) which extends outwardly from the portion thereof located between the two wiring portions WE toward a position directly above at least one of the two wiring portions WE to hang thereover.

The contact hole SCH is self-alignedly formed by further performing etching treatment on the portions of the insulating film IL and the like which are interposed between the two gate wiring portions GE extending in the X-direction, while being spaced apart from each other in the Y-direction. As a result, the polysilicon plug SCP formed in the contact hole SCH has a shape (in a direction orthogonal to the gate wiring portions) which extends outwardly from the portion thereof located between the two gate wiring portions GE toward a position directly above at least one of the two gate wiring portions GE to hang thereover.

In each of the embodiments, the semiconductor device including the SRAM memory cell has been described by way of example. However, the semiconductor device of the present invention is not limited to the semiconductor device including the SRAM memory cell. For example, the semiconductor device of the present invention is applicable to a semiconductor device in which, in a layer, at least two wiring portions (first and second wiring portions) extend in mutually spaced apart relation, in another layer, at least two wiring portions (third and fourth wiring portions) extend in mutually spaced apart relation, and the first and second wiring portions and the third and fourth wiring portions are placed so as to intersect each other.

In each of the embodiments, the polysilicon plug having the two-stage structure including the polysilicon plug SCP and the polysilicon plug BSP has been described by way of example. However, the structure of the polysilicon plug is not limited thereto. For example, the structure of the polysilicon plug is also applicable to a semiconductor device in which a contact hole is formed as the contact hole SCH to expose the semiconductor substrate without forming the polysilicon plug BSP and a polysilicon plug is formed in the contact hole.

In such a semiconductor device also, the length of the portion of the polysilicon plug which is in contact with the semiconductor substrate is controlled by the space between the wiring portions. This can suppress variations in the contact area between the polysilicon plug and the semiconductor substrate as well as fluctuations in contact resistance.

The embodiments disclosed herein are illustrative and are not limitative. The scope of the present invention is shown not by the description given above, but by the claims and is intended to include the meanings equivalent to the claims and all the modifications within the claims.

What is claimed is:

1. A semiconductor device, comprising:
   a semiconductor substrate;
   a static random access memory cell including an access transistor, a drive transistor, and a load transistor;
   first and second wiring portions formed over the semiconductor substrate to extend in a first direction, while keeping a first space therebetween, the first wiring portion being associated with the access transistor, and the second wiring portion being associated with the drive transistor;
   third and fourth wiring portions formed above the first and second wiring portions to extend in a second direction intersecting the first direction, while keeping a second space therebetween, the third and fourth wiring portions each having an uppermost surface that is insulating, the third and fourth wiring portion being electrically coupled to the static random access memory cell; and
   a contact plug having an uppermost surface that is above the uppermost insulating surfaces of the third and fourth wiring portions, the contact plug extending between the third and fourth wiring portions and between the first and second wiring portions and reaching the semiconductor substrate,
   wherein the contact plug extends outwardly from the portion thereof located between the third and fourth wiring portions toward a position immediately above at least one of the third and fourth wiring portions to hang thereover and extends outwardly from the portion thereof located between the first and second wiring portions toward a position immediately above at least one of the first and second wiring portions to hang thereover.

2. A semiconductor device according to claim 1,
   wherein the contact plug includes a lower contact plug in contact with the semiconductor substrate and an upper contact plug in contact with the lower contact plug, and
   wherein the lower contact plug is formed to be lower in level than the first and second wiring portions.

3. A semiconductor device according to claim 1, further comprising:
   an insulating protective film covering a side surface of the contact plug.

4. A semiconductor device according to claim 1, further comprising:
   wherein the first wiring portion includes a gate electrode of the access transistor,
   wherein the second wiring portion includes a gate electrode of the drive transistor,
   wherein the third wiring portion includes a bit line electrically coupled to the static random access memory cell,
   wherein the fourth wiring portion includes a ground line electrically coupled to the static random access memory cell,
   wherein, in a region of the semiconductor substrate located between the first and second wiring portions, a source region of the access transistor and a drain region of the drive transistor are formed, and
   wherein the source region and the drain region are each electrically coupled to the load transistor via the contact plug.

5. A semiconductor device, comprising:
   a semiconductor substrate;
   a static random access memory cell including an access transistor, a drive transistor, and a load tratisistor;

first and second wiring portions formed over the semiconductor substrate to extend in a first direction, while keeping a first distance therebetween the first wiring portion being associated with the access transistor, and the second wiring portion being associated with the drive transistor;

a first interlayer insulating film formed so as to cover the first and second wiring portions;

third and fourth wiring portions formed over the first interlayer insulating film to extend in a second direction intersecting the first direction, while keeping a second distance therebetween, the second distance being different from the first distance, the third and fourth wiring portion being electrically coupled to the static random access memory cell;

a second interlayer insulating film formed so as to cover the third and fourth wiring portions; and a contact plug formed so as to extend between the third and fourth wiring portions and between the first and second wiring portions and reach the semiconductor substrate, wherein each of the first, second, third, and fourth wiring portions includes a conductor portion serving as wiring, and a covering insulating film covering the conductor portion from both lateral sides of and from over the conductor portion, and wherein the contact plug is formed in a contact hole which is formed in the second and first interlayer insulating films in self-aligned relation with the third, fourth, first, and second wiring portions.

6. A semiconductor device according to claim 2, further comprising:

an insulating protective film covering a side surface of the contact plug.

7. A semiconductor device according to claim 1, wherein the first space is a first distance and the second space is a second distance, the first distance being less than the second distance.

8. A semiconductor device according to claim 1, further comprising:

a static random access memory cell including an access transistor, a drive transistor, and a load transistor.

9. A semiconductor device according to claim 8, wherein, in a region of the semiconductor substrate located between the first and second wiring portions, a source region of the access transistor and a drain region of the drive transistor are formed.

10. A semiconductor device according to claim 1, wherein the contact plug includes a portion that is over the uppermost insulating surfaces of the third and fourth wiring portions.

11. A semiconductor device according to claim 1, wherein the contact plug includes a widest portion that overhangs conductive portions of the third and fourth wiring portions.

12. A semiconductor device according to claim 5, wherein the first distance is less than the second distance.

13. A semiconductor device according to claim 5, wherein the contact plug includes a portion that is above the third and fourth wiring portions and uppermost insulating surfaces of the third and fourth wiring conductor portions.

14. A semiconductor device according to claim 5, wherein the contact plug includes a widest portion that overhangs the conductive portions of the third and fourth wiring portions.

15. A semiconductor device according to claim 5, further comprising:

wherein the first wiring portion includes a gate electrode of the access transistor, wherein the second wiring portion includes a gate electrode of the drive transistor, wherein the third wiring portion includes a bit line electrically coupled to the static random access memory cell, wherein the fourth wiring portion includes a ground line electrically coupled to the static random access memory cell, wherein, in a region of the semiconductor substrate located between the first and second wiring portions, a source region of the access transistor and a drain region of the drive transistor are formed, and wherein the source region and the drain region are each electrically coupled to the load transistor via the contact plug.

* * * * *